US011808648B2

(12) United States Patent
Tanaka et al.

(10) Patent No.: US 11,808,648 B2
(45) Date of Patent: Nov. 7, 2023

(54) MAGNETIC SENSOR AND TORQUE SENSING DEVICE HAVING THE SAME

(71) Applicant: DENSO CORPORATION, Kariya (JP)

(72) Inventors: Ken Tanaka, Kariya (JP); Toshiro Suzuki, Kariya (JP); Shigetoshi Fukaya, Kariya (JP)

(73) Assignee: DENSO CORPORATION, Kariya (JP)

( * ) Notice: Subject to any disclaimer, the term of this patent is extended or adjusted under 35 U.S.C. 154(b) by 201 days.

(21) Appl. No.: 17/408,250

(22) Filed: Aug. 20, 2021

(65) Prior Publication Data

US 2021/0381915 A1 Dec. 9, 2021

Related U.S. Application Data

(63) Continuation of application No. PCT/JP2020/006850, filed on Feb. 20, 2020.

(30) Foreign Application Priority Data

Feb. 25, 2019 (JP) .................................. 2019-031658

(51) Int. Cl.
*G01L 3/10* (2006.01)
*G01R 33/00* (2006.01)
(Continued)

(52) U.S. Cl.
CPC .......... *G01L 3/101* (2013.01); *G01R 33/0011* (2013.01); *G01R 33/0047* (2013.01);
(Continued)

(58) Field of Classification Search
CPC ..... G01L 3/104; G01L 3/101; G01R 33/0011; G01R 33/0047; H05K 1/183; H05K 2201/10151; B62D 6/10
See application file for complete search history.

(56) References Cited

U.S. PATENT DOCUMENTS 7,644,635 B2   1/2010  Prudham et al.
11,035,745 B2 * 6/2021  Tanaka ............... G01R 33/0011
(Continued)

FOREIGN PATENT DOCUMENTS

JP   4968517 B2   7/2012
JP   5153490 B2   2/2013
(Continued)

OTHER PUBLICATIONS

U.S. Appl. No. 17/408,101, filed Aug. 20, 2021, Tanaka et al.

*Primary Examiner* — Octavia Davis Hollington
(74) *Attorney, Agent, or Firm* — POSZ LAW GROUP, PLC

(57) ABSTRACT

A sensor housing has a receiving recess at one end portion of the sensor housing located at one end of the sensor housing. The one end portion of the sensor housing faces first and second magnetic circuit portions. A circuit board is received in the receiving recess and has an opening, a front-side region and a rear-side region. The front-side region is located on a side of the opening where the one end of the sensor housing is placed. The rear-side region is located on an opposite side of the opening. A main body of a magnetic sensing device overlaps the opening such that terminals projecting from one of a pair of side walls of the main body are located at the front-side region, and terminals projecting from another one of the pair of side walls is located at the rear-side region.

6 Claims, 21 Drawing Sheets

(51) Int. Cl.
 H05K 1/18 (2006.01)
 B62D 6/10 (2006.01)
(52) U.S. Cl.
 CPC .............. *H05K 1/183* (2013.01); *B62D 6/10* (2013.01); *H05K 2201/10151* (2013.01)

(56) References Cited

U.S. PATENT DOCUMENTS

| | | |
|---|---|---|
| 2008/0250873 A1 | 10/2008 | Prudham et al. |
| 2011/0221432 A1 | 9/2011 | Oota |
| 2012/0285266 A1 | 11/2012 | Takahashi et al. |
| 2015/0369679 A1 | 12/2015 | Ishimoto |
| 2016/0153849 A1 | 6/2016 | Takahashi et al. |
| 2016/0153850 A1 | 6/2016 | Takahashi et al. |
| 2017/0336276 A1* | 11/2017 | Toyama ................ G01D 11/245 |
| 2020/0041366 A1 | 2/2020 | Tanaka et al. |
| 2020/0047790 A1 | 2/2020 | Maehara |

FOREIGN PATENT DOCUMENTS

| | | | | |
|---|---|---|---|---|
| JP | 5205891 B2 | 6/2013 | | |
| JP | 2015190816 A | * 11/2015 | ............. | G01L 3/101 |
| WO | WO-2023027038 A1 | * 3/2023 | | |

\* cited by examiner

FLOW OF MAGNETIC FLUX

NUMBER OF MAGNETIC POLES IN RADIATION RANGE

MAGNETIC SENSOR AND TORQUE SENSING DEVICE HAVING THE SAME

CROSS REFERENCE TO RELATED APPLICATIONS

This application is a continuation application of International Patent Application No. PCT/JP2020/006850 filed on Feb. 20, 2020, which designated the U.S. and claims the benefit of priority from Japanese Patent Application No. 2019-31658 filed on Feb. 25, 2019. The entire disclosures of all of the above applications are incorporated herein by reference.

TECHNICAL FIELD

The present disclosure relates to a magnetic sensor and a torque sensing device having the same.

BACKGROUND

Previously, there has been proposed a torque sensing device that senses a torque by sensing a magnetic flux which changes in response to twisting of a torsion bar. Specifically, this torque sensing device includes magnetic circuit portions that generate the magnetic flux in response to the twisting of the torsion bar. Furthermore, the torque sensing device includes magnetic flux guide members and a magnetic sensor. The magnetic flux guide members are magnetically coupled to the magnetic circuit portions and guide the magnetic flux. The magnetic sensor includes magnetic sensing devices each of which outputs an electrical signal that corresponds to the magnetic flux guided by the magnetic flux guide members.

SUMMARY

This section provides a general summary of the disclosure, and is not a comprehensive disclosure of its full scope or all of its features.

According to the present disclosure, there is provided a magnetic sensor configured to output an electrical signal corresponding to a magnetic flux generated between a first magnetic circuit portion and a second magnetic circuit portion which are opposed to each other. The magnetic sensor includes a sensor housing, a circuit board, a magnetic sensing device and a pair of magnetic flux guide members. The sensor housing has a receiving recess at one end portion of the sensor housing located at one end of the sensor housing, wherein the one end portion of the sensor housing is configured to face the first magnetic circuit portion and the second magnetic circuit portion. The circuit board that is received in the receiving recess. The magnetic sensing device that is installed to the circuit board and is configured to output the electrical signal which corresponds to the magnetic flux. The pair of magnetic flux guide members are configured to guide the magnetic flux to the magnetic sensing device. The circuit board has an opening, a front-side region and a rear-side region. The front-side region is located on a side of the opening where the one end of the sensor housing is placed. The rear-side region is located on an opposite side of the opening that is opposite to the front-side region. The magnetic sensing device has a main body and a plurality of terminals. The main body has a pair of side walls that are opposed to each other. The plurality of terminals project outward from the pair of side walls such that one or more of the plurality of terminals project outward from one of the pair of side walls, and another one or more of the plurality of terminals project outward from another one of the pair of side walls. The magnetic sensing device is installed to the circuit board such that the main body overlaps the opening in a normal direction that is perpendicular to a plane of the circuit board, wherein the one or more of the plurality of terminals projecting outward from the one of the pair of side walls is located at the front-side region, and the another one or more of the plurality of terminals projecting outward from the another one of the pair of side walls is located at the rear-side region.

According to the present disclosure, there is also provided a torque sensing device having the above magnetic sensor.

BRIEF DESCRIPTION OF DRAWINGS

The drawings described herein are for illustrative purposes only of selected embodiments and not all possible implementations, and are not intended to limit the scope of the present disclosure.

DETAILED DESCRIPTION

Figure 1:
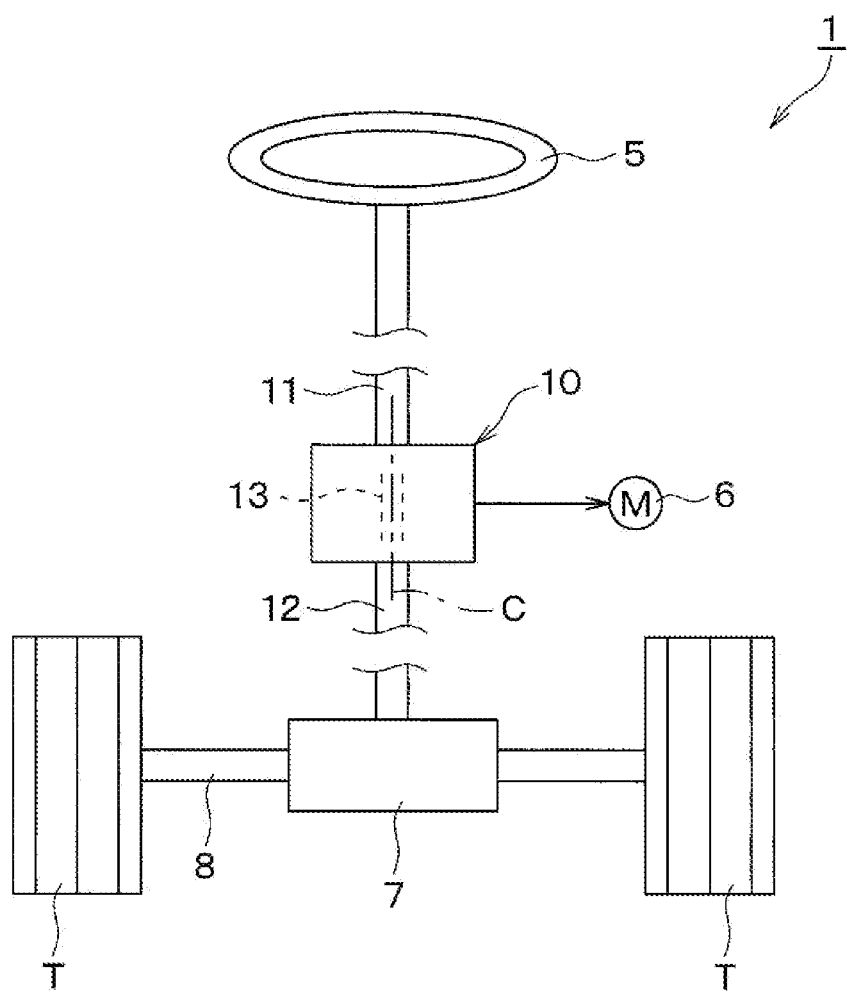
FIG. 1 is a schematic diagram showing a structure of an electric power steering apparatus having a torque sensing device according to a first embodiment.

Previously, there has been proposed a torque sensing device that senses a torque by sensing a magnetic flux which changes in response to twisting of a torsion bar. Specifically, this torque sensing device includes magnetic circuit portions that generate the magnetic flux in response to the twisting of the torsion bar. Furthermore, the torque sensing device includes magnetic flux guide members and a magnetic sensor. The magnetic flux guide members are magnetically coupled to the magnetic circuit portions and guide the magnetic flux. The magnetic sensor includes magnetic sensing devices each of which outputs an electrical signal that corresponds to the magnetic flux guided by the magnetic flux guide members.

The torque sensing device is formed such that the magnetic circuit portions are received on an inner side of an inside of a receiving wall that has an installation hole, and the magnetic flux guide members of the magnetic sensor are installed in the installation hole such that the magnetic flux guide members are placed adjacent to the magnetic circuit portions.

The magnetic sensor includes a sensor housing that holds a circuit board and the magnetic flux guide members while the magnetic sensing devices are installed to the circuit board. Specifically, the circuit board has two cutouts. Each cutout extends in an inserting direction of the magnetic sensor into the installation hole of the receiving wall and opens to an outer edge of the circuit board located on a side where the magnetic circuit portions are placed at the time of installing the magnetic sensor into the installation hole, and a portion of the corresponding one of the magnetic flux guide members is inserted into the cutout. Each magnetic sensing device includes a main body and terminals. A Hall element or the like is sealed in the main body that is shaped generally in a flat rectangular form and has a pair of opposed side walls. The terminals project outward from the side walls. Each magnetic sensing device is installed to the circuit board such that the main body is placed over the corresponding cutout, and the terminals, which project from one of the pair of side walls, are located on one side of the cutout, and the terminals, which project from the other one of the pair of side walls, are located on the other side of the cutout. Specifically, each magnetic sensing device is installed to the circuit board such that the terminals extend in a direction that is perpendicular to the inserting direction of the magnetic sensor.

In the above magnetic sensor, since the terminals extend in the direction perpendicular to the inserting direction relative to the magnetic circuit portions at the time of constructing the torque sensing device having the magnetic sensor, a length (width) of the magnetic sensor measured in the direction perpendicular to the inserting direction is likely increased. Therefore, a size of the installation hole formed at the receiving wall is likely increased, and a size of an installation space for installing the torque sensing device is likely increased. However, in recent years, in a case where the magnetic sensor is installed on a vehicle or the like, it has been demanded to reduce the size of the magnetic sensor and the size of the installation space from the viewpoint of improving the installability on the vehicle.

According to one aspect of the present disclosure, there is provided a magnetic sensor configured to output an electrical signal corresponding to a magnetic flux generated between a first magnetic circuit portion and a second magnetic circuit portion which are opposed to each other. The magnetic sensor includes a sensor housing, a circuit board, a magnetic sensing device and a pair of magnetic flux guide members. The sensor housing has a receiving recess at one end portion of the sensor housing located at one end of the sensor housing. The one end portion of the sensor housing is configured to face the first magnetic circuit portion and the second magnetic circuit portion. The circuit board is received in the receiving recess. The magnetic sensing device is installed to the circuit board and is configured to output the electrical signal which corresponds to the magnetic flux. The pair of magnetic flux guide members are respectively made of a soft magnetic material and are configured to guide the magnetic flux to the magnetic sensing device. The pair of magnetic flux guide members are opposed to each other while the magnetic sensing device is interposed between the pair of magnetic flux guide members. The circuit board has an opening, a front-side region and a rear-side region. The front-side region is located on a side of the opening where the one end of the sensor housing is placed. The rear-side region is located on an opposite side of the opening that is opposite to the front-side region. The magnetic sensing device has a main body and a plurality of terminals. The main body has a pair of side walls that are opposed to each other. The plurality of terminals project outward from the pair of side walls such that one or more of the plurality of terminals project outward from one of the pair of side walls, and another one or more of the plurality of terminals project outward from another one of the pair of side walls. The magnetic sensing device is installed to the circuit board such that the main body overlaps the opening in a normal direction that is perpendicular to a plane of the circuit board, wherein the one or more of the plurality of terminals projecting outward from the one of the pair of side walls is located at the front-side region, and the another one or more of the plurality of terminals projecting outward from the another one of the pair of side walls is located at the rear-side region. One of the pair of magnetic flux guide members is placed in the opening.

According to this aspect, the magnetic sensing device is installed to the circuit board such that the one or more of the plurality of terminals is located at the front-side region, and the another one or more of the plurality of terminals is located at the rear-side region. Therefore, it is possible to limit an increase in a length of the circuit board in a direction intersecting an alignment direction that is a direction, in which the first section and the second section are aligned. That is, in a case where a torque sensing device is formed by using the magnetic sensor, the magnetic sensor can limit an increase in the length of the magnetic sensor in the direction intersecting the inserting direction at the time of forming a torque sensing device. Furthermore, in the case where the torque sensing device is formed by using the magnetic sensor, the magnetic sensor is installed in a hole formed at, for example, a wall. In such a case, since it is possible to limit an increase in the length of the magnetic sensor in the direction intersecting the inserting direction, the size of the hole can be reduced. Thus, it is possible to reduce the size of the installation space.

Furthermore, according to another aspect of the present disclosure, there is provided a torque sensing device configured to output an electrical signal that corresponds to a torsional torque generated at a torsion bar in response to relative rotation about a rotational axis between a first shaft and a second shaft which are coaxially coupled through the torsion bar along the rotational axis. The torque sensing device includes the above magnetic sensor, the first magnetic circuit portion and the second magnetic circuit portion. The first magnetic circuit portion is placed at one side of a multipole magnet in an axial direction of the rotational axis. The multipole magnet has a plurality of magnetic poles which are arranged in a circumferential direction about the rotational axis such that polarities of the plurality of magnetic poles are alternately changed in the circumferential direction. The multipole magnet is placed coaxially with the torsion bar such that the multipole magnet is rotated about the rotational axis in response to the relative rotation. The second magnetic circuit portion is placed at another side of the multipole magnet in the axial direction. The magnetic sensor is placed such that the pair of magnetic flux guide members are magnetically coupled to a magnetic circuit that is formed by the first magnetic circuit portion and the second magnetic circuit portion. The pair of magnetic flux guide members include a first magnetic flux guide member, which has a main body opposed to the first magnetic circuit portion, and a second magnetic flux guide member, which has a main body opposed to the second magnetic circuit portion. Each of the main body of the first magnetic flux guide member and the main body of the second magnetic flux guide member is configured as follows: the main body has a pair of outer end portions that are respectively placed on one circumferential side and another circumferential side of a reference line which is an imaginary line being perpendicular to the rotational axis and intersecting the main body; a distance measured between the rotational axis and the main body is set such that the distance measured at each of the pair of outer end portions is longer than the distance measured at an intermediate portion of the main body circumferentially located between the pair of outer end portions; and one or more of the plurality of magnetic poles of the multipole magnet is placed in a magnetic flux radiation range of the first shaft that is a circumferential range defined between two imaginary lines while a number of the one or more of the plurality of magnetic poles of the multipole magnet is within a predetermined range, wherein one of the two imaginary lines radially connects a radially inner side part of one of the pair of outer end portions to the rotational axis, and another one of the two imaginary lines radially connects a radially inner side part of another one of the pair of outer end portions to the rotational axis.

According to this aspect, due to the provision of the above magnetic sensor, the size of the torque sensing device can be reduced. Furthermore, the shape of the main body of each of the magnetic flux guide members is defined according to the relationship between the main body and the multipole magnet, so that influence of a noise can be reduced.

Hereinafter, embodiments of the present disclosure will be described with reference to the drawings. In each of the following embodiments, components, which are the same or equal to each other, will be described with the same reference signs.

First Embodiment

A first embodiment will be described. In the present embodiment, there will be described an example, in which a torque sensing device having a magnetic sensor is constructed, and this torque sensing device is used to construct an electric power steering apparatus of a vehicle. In the present embodiment, a so-called column-type electric power steering apparatus will be described.

The electric power steering apparatus 1 includes a steering wheel 5, an electric motor 6, a steering gear mechanism 7, two link mechanisms 8 and a torque sensing device 10. The electric power steering apparatus 1 drives the electric motor 6 in response to an operational state of the steering wheel 5 to transmit a drive force of the electric motor 6 to the steering gear mechanism 7. In this way, the electric power steering apparatus 1 assists a steering force for changing an orientation of wheels T of the vehicle through the link mechanisms 8.

The torque sensing device 10 is placed between the steering wheel 5 and the steering gear mechanism 7 such that the torque sensing device 10 outputs an electrical signal (e.g., a voltage) according to the operational state of the steering wheel 5. Specifically, the torque sensing device 10 is placed at a connection between a first shaft 11 and a second shaft 12. The first shaft 11 is coupled to the steering wheel 5 through a coupling mechanism (not shown) such that the first shaft 11 is rotated integrally with the steering wheel 5. The second shaft 12 is coupled to the steering gear mechanism 7 through a coupling mechanism (not shown).

Figure 2:
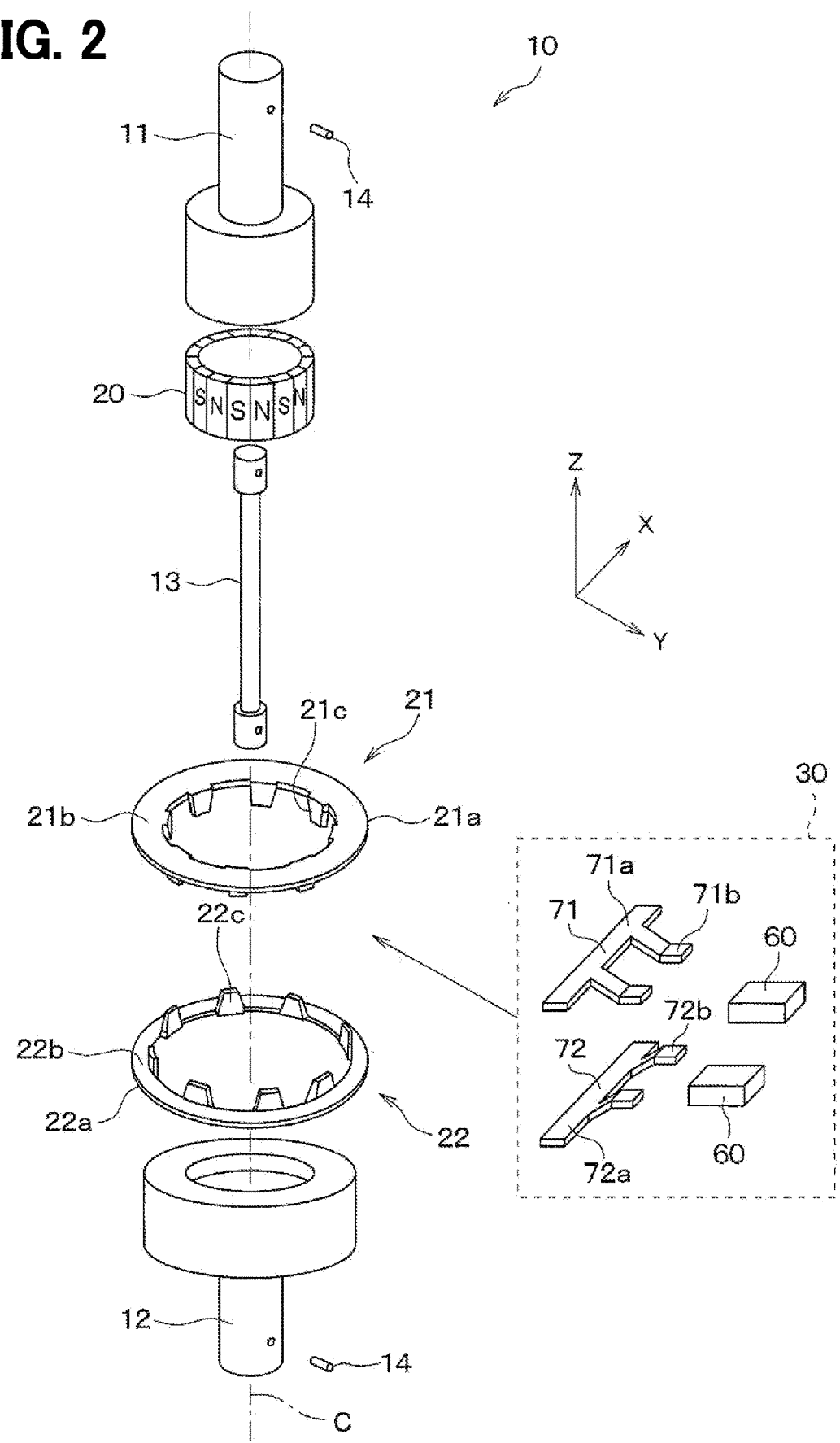
FIG. 2 is an exploded perspective view of the torque sensing device shown in FIG. 1.

The first shaft 11 and the second shaft 12 are coaxially coupled through a torsion bar 13 along the rotational axis C. The torque sensing device 10 is configured to output the electrical signal that corresponds to a torsional torque generated in torsion bar 13 in response to relative rotation about the rotational axis C between the first shaft 11 and the second shaft 12. As shown in FIG. 2 described later, the torsion bar 13 is fixed to the first shaft 11 and the second shaft 12 with fixation pins 14.

Next, a basic structure of the torque sensing device 10 of the present embodiment will be described with reference to FIG. 2. For convenience of explanation, in each of the following drawings, a right-handed XYZ Cartesian coordinate system, in which the Z-axis is parallel to the rotational axis C, is set. A direction, which is parallel to the Z-axis, is also referred to as an axial direction. A direction, which is parallel to the X-axis, is also referred to as a width direction. Furthermore, for convenience of explanation, the Z-axis positive direction side is also referred to as an upper side, and the Z-axis negative direction side is also referred to as a lower side. In many cases, the rotational axis C is not parallel to the height direction of the vehicle.

The torque sensing device 10 includes a multipole magnet 20. The multipole magnet 20 is placed coaxially with the torsion bar 13 such that the multipole magnet 20 is rotated about the rotational axis C in response to relative rotation between the first shaft 11 and the second shaft 12. Specifically, the multipole magnet 20 is shaped in a cylindrical tubular form and is fixed to a lower end portion of the first shaft 11. The multipole magnet 20 has a plurality of magnetic poles which are arranged in a circumferential direction about the rotational axis C such that polarities of the magnetic poles are alternately changed in the circumferential direction.

The circumferential direction is typically a circumferential direction of a circle formed in the X-Y plane around an intersection where the rotational axis C intersects the X-Y plane. In the present embodiment, the multipole magnet 20 has eight N-poles and eight S-poles, i.e., a total of sixteen magnetic poles that are arranged at 22.5 degree intervals.

The first magnetic circuit portion 21 is placed at one side (i.e., an upper end side) of the multipole magnet 20 in the axial direction. The first magnetic circuit portion 21 includes a first yoke member 21a. The first yoke member 21a is shaped in a ring form and is made of a soft magnetic material. The first yoke member 21a surrounds one axial end portion (i.e., an upper end portion) of the multipole magnet 20.

Specifically, the first yoke member 21a includes a first ring plate 21b and a plurality of first-side teeth 21c. The first ring plate 21b is shaped in a flat ring form and surrounds the rotational axis C. Specifically, the first ring plate 21b has a circular opening which is centered on the rotational axis C. The first-side teeth 21c are arranged at equal intervals in the circumferential direction such that the first-side teeth 21c surround the multipole magnet 20. Each of the first-side teeth 21c extends downward in the axial direction of the rotational axis C from an inner periphery of the opening of the first ring plate 21b.

The second magnetic circuit portion 22 is placed at another side (i.e., a lower end side) of the multipole magnet 20 in the axial direction. The second magnetic circuit portion 22 includes a second yoke member 22a. The second yoke member 22a is shaped in a ring form and is made of a soft magnetic material. The second yoke member 22a surrounds another axial end portion (i.e., a lower end portion) of the multipole magnet 20.

Specifically, the second yoke member 22a includes a second ring plate 22b and a plurality of second-side teeth 22c. The second ring plate 22b is shaped in a flat ring form and surrounds the rotational axis C. Specifically, the second ring plate 22b has a circular opening which is centered on the rotational axis C. The second-side teeth 22c are arranged at equal intervals in the circumferential direction such that the second-side teeth 22c surround the multipole magnet 20. Each of the second-side teeth 22c extends upward in the axial direction of the rotational axis C from an inner periphery of the opening of the second ring plate 22b.

Figure 3:
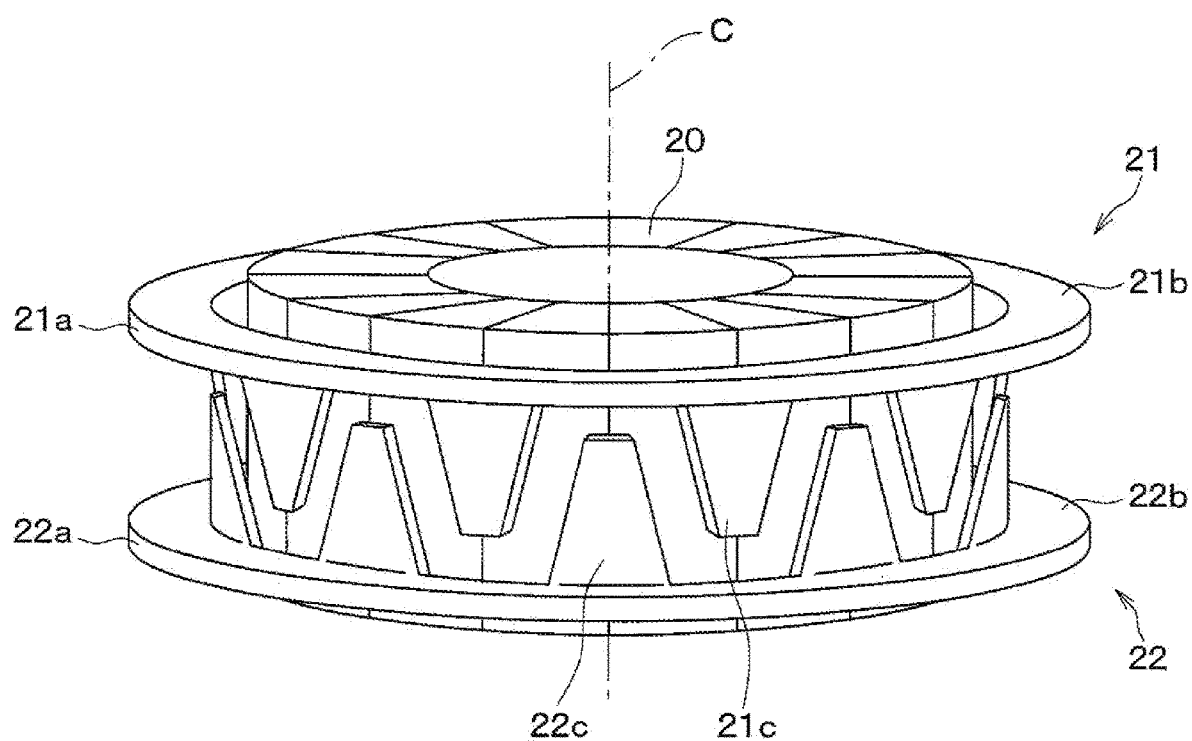
FIG. 3 is an enlarged perspective view showing a multipole magnet, a first magnetic circuit portion and a second magnetic circuit portion of the torque sensing device of FIG. 2, which are assembled together.

The first magnetic circuit portion 21 and the second magnetic circuit portion 22 are arranged in the axial direction and are opposed to each other while a predetermined gap is interposed between the first magnetic circuit portion 21 and the second magnetic circuit portion 22. Specifically, as shown in FIG. 3, the second ring plate 22b is arranged such that the second ring plate 22b opposes the first ring plate 21b in the axial direction. In other words, when the first ring plate 21b and the second ring plate 22b are viewed in the axial direction, the first ring plate 21b and the second ring plate 22b overlap with each other. The first-side teeth 21c and the second-side teeth 22c are alternately arranged in the circumferential direction. The first magnetic circuit portion 21 and the second magnetic circuit portion 22 are coupled to an upper end portion of the second shaft 12 and are rotated integrally with the second shaft 12. Therefore, the first magnetic circuit portion 21 and the second magnetic circuit portion 22 are rotatable relative to the multipole magnet 20. Thereby, the first magnetic circuit portion 21 and the second magnetic circuit portion 22 form a magnetic circuit in a magnetic field generated from the multipole magnet 20. In the present embodiment, the axial direction corresponds to an arrangement direction of the first and second magnetic circuit portions 21, 22.

Figure 4A:
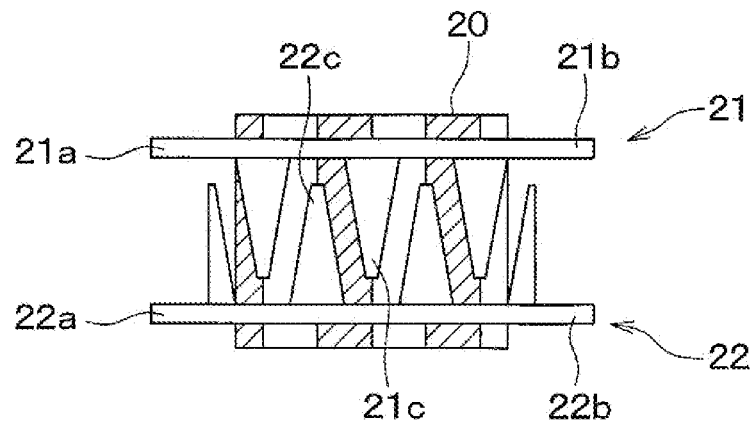
FIG. 4A is a side view showing a relative rotational state of the multipole magnet, the first magnetic circuit portion and the second magnetic circuit portion shown in FIG. 3.
Figure 4B:
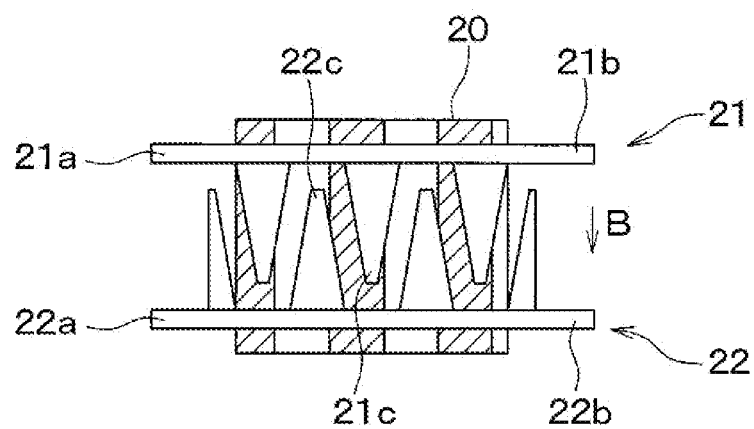
FIG. 4B is a side view showing another relative rotational state of the multipole magnet, the first magnetic circuit portion and the second magnetic circuit portion shown in FIG. 3.
Figure 4C:
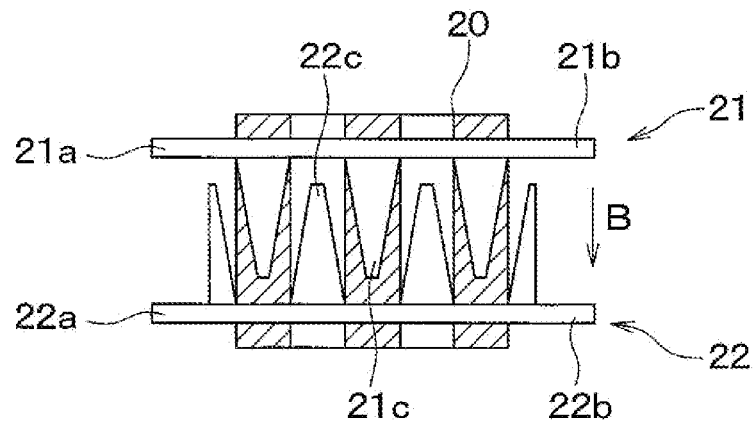
FIG. 4C is a side view showing a further relative rotational state of the multipole magnet, the first magnetic circuit portion and the second magnetic circuit portion shown in FIG. 3.

In an assembled state where a torsional torque is not applied to the torsion bar 13, the multipole magnet 20, the first magnetic circuit portion 21 and the second magnetic circuit portion 22 are phase-aligned into a neutral state in the circumferential direction, as shown in FIGS. 3 and 4A. The neutral state is a state where a circumferential center of each of the first-side teeth 21c and the second-side teeth 22c coincides with a corresponding boundary between the corresponding adjacent N-pole and the corresponding adjacent S-pole. When the torsional torque is generated at the torsion bar 13 by relative rotation between the first and second shafts 11, 12, the phase of the first and second magnetic circuit portions 21, 22 is shifted from the neutral state, as shown in FIGS. 4B and 4C. In this way, the first and second magnetic circuit portions 21, 22 generate a magnetic flux density B that corresponds to the amount of phase shift.

As shown in FIG. 2, the torque sensing device 10 is configured such that a magnetic sensor 30, which includes a pair of magnetic sensing devices 60 and first and second magnetic flux guide members 71, 72, is placed adjacent to the first magnetic circuit portion 21 and the second magnetic circuit portion 22. The magnetic sensor 30 is configured to output an electrical signal, which corresponds to a magnetic flux generated at the first and second magnetic circuit portions 21, 22, i.e., an electrical signal which corresponds to the torsional torque generated at the torsion bar 13. Hereinafter, the structure of the magnetic sensor 30 of the present embodiment will be described in detail with reference to FIGS. 5, 6, 7A and 7B. A right-handed XYZ Cartesian coordinate system shown in FIGS. 5, 6, 7A and 7B corresponds to the right-handed XYZ Cartesian coordinate system shown in FIG. 2. Furthermore, depiction of a waterproof covering material 80 described later is omitted in FIG. 5 for the sake of simplicity.

Figure 5:
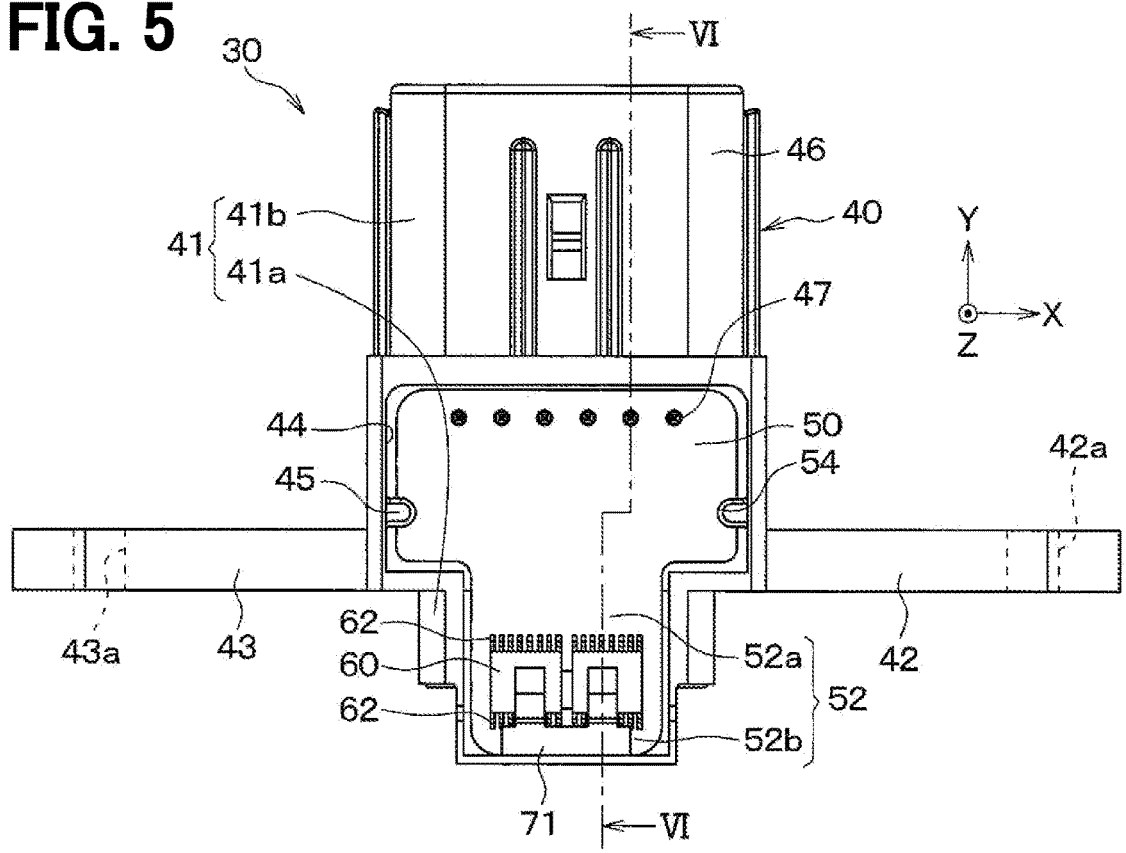
FIG. 5 is a front view of a magnetic sensor of the first embodiment.
Figure 6:
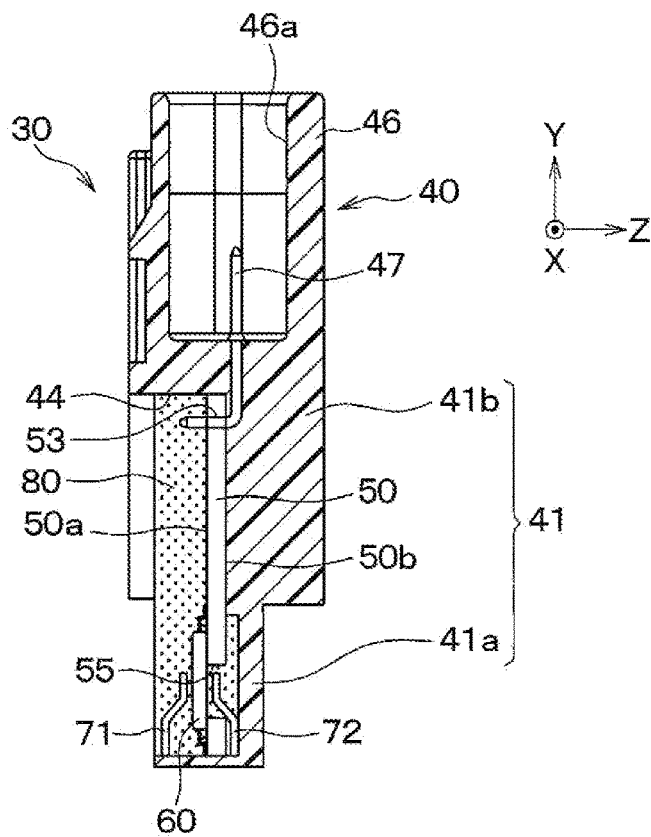
FIG. 6 is a cross-sectional view taken along line VI-VI in FIG. 5.

As shown in FIGS. 5 and 6, the magnetic sensor 30 of the present embodiment includes a sensor housing 40, a circuit board 50, the magnetic sensing devices 60 and the first and second magnetic flux guide members 71, 72.

The sensor housing 40 is formed by molding dielectric synthetic resin with a molding die. The sensor housing 40 has a base body 41, a first flange 42 and a second flange 43. The base body 41 is shaped in a columnar form that extends in the direction of the Y-axis. The first and second flanges 42, 43 extend oppositely from the base body 41 in the direction of the Y-axis. Hereinafter, a lower end of the sensor housing 40 and the base body 41 in FIG. 5 will be also referred to as one end of the sensor housing 40 and the base body 41, and an upper end of the sensor housing 40 and the base body 41 in FIG. 5 will be also referred to as the other end of the sensor housing 40 and the base body 41. Furthermore, a lower side of the sensor housing 40 and the base body 41 in FIG. 5 will be also referred to as one end portion side, and an upper side of the sensor housing 40 and the base body 41 in FIG. 5 will be also referred to as the other end portion side. That is, in FIG. 8, which will be described later, the end portion of the sensor housing 40 and the base body 41, which is closer to the first and second magnetic circuit portions 21, 22 in comparison to the other end portion of the sensor housing 40 and the base body 41 in the direction of the Y-axis, will be also referred to as the one end portion side (or one end portion), and the other end portion of the sensor housing 40 and the base body 41, which is opposite to the one end portion side, will be also referred to as the other end portion side (or the other end portion).

The first and second flanges 42, 43 are provided to the base body 41 such that the first and second flanges 42, 43 are located closer to the one end of the base body 41 than an intermediate portion between the one end and the other end of the base body 41 in the direction of the Y-axis, and the first and second flanges 42, 43 are arranged generally symmetrically with respect to the base body 41 that is interposed between the first and second flanges 42, 43. Each of the first and second flanges 42, 43 has a fixation hole 42a, 43a which extends through the flange 42, 43 in the direction of the Y-axis. Hereinafter, a portion of the base body 41, which is located on one side of the first and second flanges 42, 43 where the one end of the base body 41 is placed, will be also referred to as a front-side portion 41a, and another portion of the base body 41, which is located on the other side of the first and second flanges 42, 43 where the other end of the base body 41 is placed, will be also referred to as a rear-side portion 41b. That is, the first and second flanges 42, 43 are provided at a boundary portion between the front-side portion 41a and the rear-side portion 41b. More specifically, the first and second flanges 42, 43 are located on the front-side portion 41a side of the rear-side portion 41b.

A receiving recess 44 is formed at the one end portion side of the base body 41. Specifically, the receiving recess 44 is formed in the base body 41 such that the receiving recess 44 extends from a part of the rear-side portion 41b, which is located on the front-side portion 41a side, to the front-side portion 41a. A segment of the base body 41, which extends from the part of the rear-side portion 41b located on the front-side portion 41a side to the front-side portion 41a, is shaped in a rectangular columnar form, and the receiving recess 44 is formed in this rectangular columnar segment of the base body 41. Specifically, in the present embodiment, the receiving recess 44 is formed at a side surface of the one end portion side of the base body 41.

The receiving recess 44 is configured to receive the circuit board 50 and has a shape that corresponds to an outer shape of the circuit board 50. In the present embodiment, as will be described later, since the circuit board 50 is shaped in a flat convex form (stepped form), the receiving recess 44 is also shaped in a flat convex form (stepped form). Specifically, the receiving recess 44 is shaped in the flat convex form such that a front portion of the receiving recess 44 located in the front-side portion 41a has a width that is measured in the width direction and is smaller than that of a rear portion of the receiving recess 44 located in the rear-side portion 41b.

Furthermore, a projection 45 for positioning the circuit board 50 is formed at each of a pair of opposed side surfaces of the receiving recess 44. Although not particularly limited, in the present embodiment, the projections 45 are respectively formed at the pair of opposed side surfaces which are located in the receiving recess 44 and extend in the direction of the Y-axis in the rear-side portion 41b.

The other end portion side of the base body 41 is formed as a connector 46 that is electrically connected to an external device, and an opening 46a is formed at the connector 46. The external device may be, for example, an electronic control unit (ECU) or the like.

Further, a plurality of terminals 47 is integrated in the base body 41 by insert molding or the like. Specifically, each terminal 47 is installed in the base body 41 such that one end portion of the terminal 47 is exposed from the receiving recess 44, and the other end portion of the terminal 47 is exposed from the opening 46a. Furthermore, the one end portion of the terminal 47, which is exposed from the receiving recess 44, is inserted through a corresponding one of a plurality of insertion holes 53 formed in the circuit board 50 described later and is electrically and mechanically connected to the circuit board 50. The other end portion of the terminal 47, which is exposed from the opening 46a, is electrically connected to the external device.

Furthermore, the base body 41 is shaped in the flat convex form which corresponds to the shape of the receiving recess 44 such that a width of the front-side portion 41a measured in the width direction is smaller than that of the rear-side portion 41b. That is, the base body 41 is shaped in the stepped form which corresponds to the shape of the circuit board 50 such that the width of the front-side portion 41a is smaller than that of the rear-side portion 41b. Specifically, in the present embodiment, as described later with reference to FIG. 8, the magnetic sensor 30 is installed to the receiving wall W, which has an installation hole W1, such that the front-side portion 41a is placed in the installation hole W1. Therefore, the magnetic sensor 30 is formed such that the width of the front-side portion 41a, which is placed in the installation hole W1, is smaller than that of the rear-side portion 41b, which is placed at the outside of the installation hole W1.

Figure 7A:
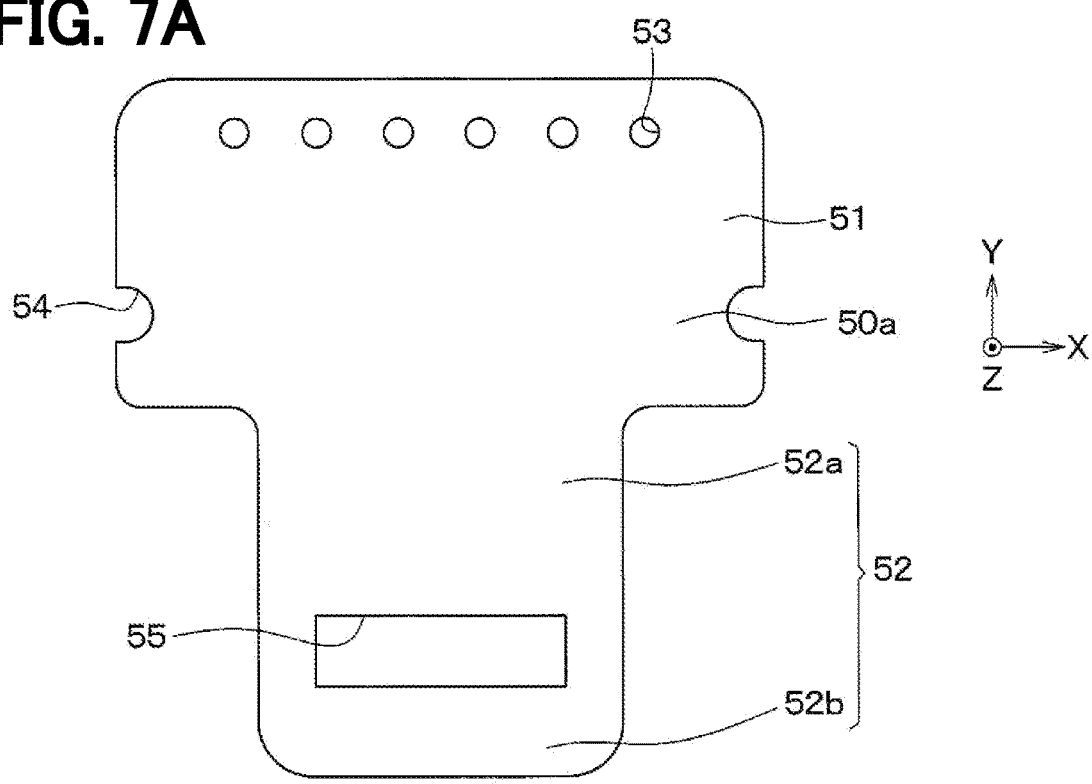
FIG. 7A is a plan view of a circuit board of the first embodiment.

As shown in FIGS. 5, 6 and 7A, the circuit board 50 is shaped in a plate form and has one surface 50a and the other surface 50b. In the present embodiment, the circuit board 50 is shaped in the flat convex form and has a first section 51 and a second section 52. The second section 52 is located on one side of the first section 51 in the direction of the Y-axis, and a width of the second section 52 is smaller than that of the first section 51. Here, in the circuit board 50, a direction, in which the first section 51 and the second section 52 are aligned, is defined as an alignment direction, and the width of the second section 52, which is measured in a direction intersecting the alignment direction, is smaller than the width of the first section 51, which is measured in the direction that intersects the alignment direction.

The circuit board 50 is installed to the receiving recess 44 such that the first section 51 is placed at the other end portion side of the sensor housing 40. Furthermore, the circuit board 50 is formed such that a boundary between the first section 51 and the second section 52 generally coincides a boundary between the front-side portion 41a and the rear-side portion 41b of the sensor housing 40. Therefore, the sensor housing 40 is shaped such that the width of the front-side portion 41a is smaller than that of the rear-side portion 41b.

The first section 51 of the circuit board 50 has the insertion holes 53 which respectively receive the one end portions of the terminals 47, and two recesses 54, which respectively correspond to the projections 45 of the receiving recess 44.

The second section 52 of the circuit board 50 has an opening 55, into which extensions 72b of the second magnetic flux guide member 72 described later are inserted. Specifically, the opening 55 of the present embodiment is formed such that opening 55 substantially separates a rear-side region 52a and a front-side region 52b in the second section 52. The rear-side region 52a is located on one side of the opening 55 where the first section 51 is placed. The front-side region 52b is located on the other side of the opening 55, which is opposite to the first section 51. In the present embodiment, the opening 55 is not opened to an outer edge of the circuit board 50. Specifically, in the present embodiment, a periphery of the opening 55 is entirely surrounded by the circuit board 50. Furthermore, the opening 55 is shaped in a rectangular form that is elongated in a longitudinal direction thereof which is parallel to the width direction of the circuit board 50 (i.e., the direction of the X-axis).

Figure 7B:
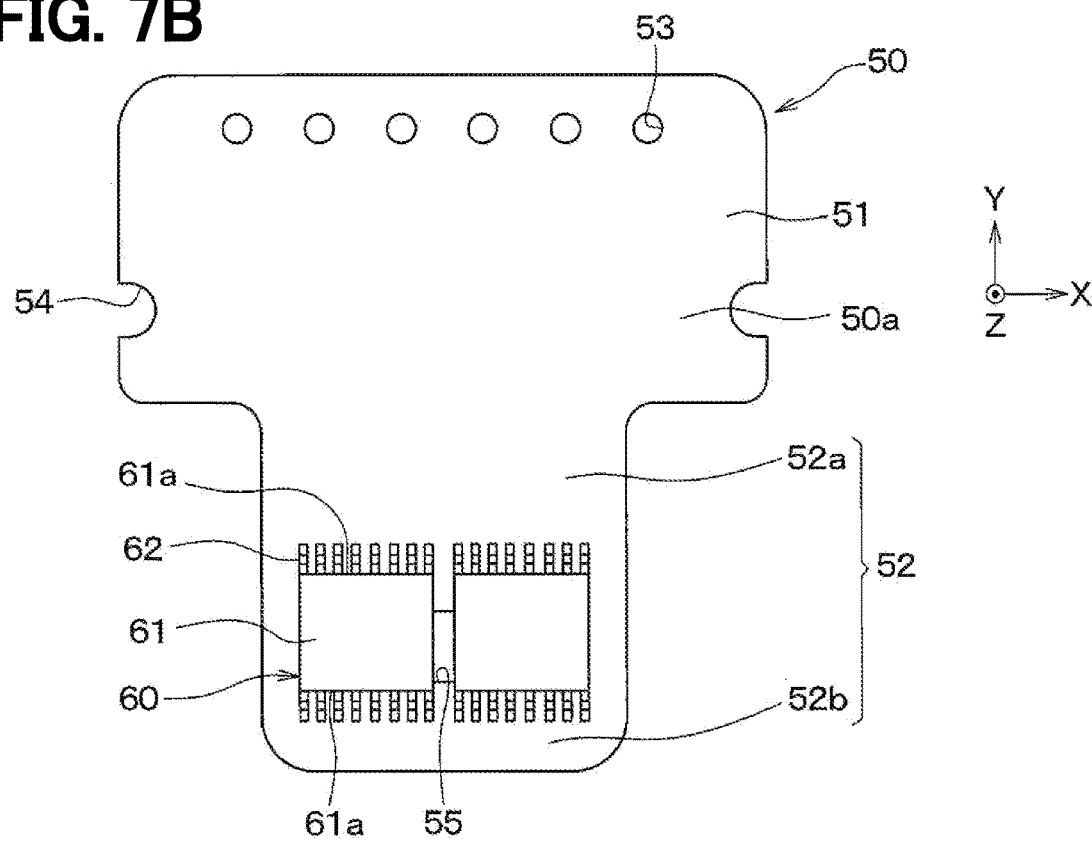
FIG. 7B is a plan view of the circuit board to which magnetic sensing devices are installed according to the first embodiment.

The magnetic sensing devices 60 are configured to output the electrical signal that corresponds to the magnetic flux of the magnetic circuit formed by the first magnetic circuit portion 21 and the second magnetic circuit portion 22. In the present embodiment, as shown in FIG. 7B, the number of the magnetic sensing devices 60 is two, and these magnetic sensing devices 60 are arranged side by side in the direction of the X-axis on the one surface 50a of the circuit board 50. In the present embodiment, by providing the two magnetic sensing devices 60 in this way, it is possible to continue the sensing of the magnetic field even if one of them becomes inoperable due to a failure or the like.

Each magnetic sensing device 60 is formed by sealing a magnetic sensitive element, such as a Hall element, at the inside of the magnetic sensing device 60 and has a main body 61. The main body 61 is shaped generally in a flat rectangular form and has a pair of side walls 61a which are opposed to each other in the direction of the Y-axis. Furthermore, in each of the magnetic sensing device 60, a plurality of terminals 62 project outward from each of the side walls 61a in a direction which intersects the side wall 61a.

Each magnetic sensing device 60 is installed to the circuit board 50 such that at least a portion of the main body 61 overlaps the opening 55 when the magnetic sensing device 60 is viewed in a normal direction that is perpendicular to a plane of the circuit board 50. Furthermore, each magnetic sensing device 60 is installed to the circuit board 50 such that the terminals (also referred to as rear-side terminals) 62, which project outward from the one of the pair of side walls 61a, are located at the rear-side region 52a, and the terminals (also referred to as front-side terminals) 62, which project outward from the other one of the pair of side walls 61a, are located at the front-side region 52b. Specifically, the magnetic sensing device 60 is installed to the circuit board 50 such that the terminals 62, which project outward from the one of the pair of side walls 61a, are located on the one side of the opening 55 where the rear-side region 52a is placed, and the terminals 62, which project outward from the other one of the pair of side walls 61a, are located on the other side of the opening 55 where the front-side region 52b is placed.

Although not particularly shown in the drawings, an electronic component (including a chip capacitor such as a ceramic capacitor), a ferrite or the like may be mounted on the circuit board 50 as a noise removing component. In such a case, the noise removing component is preferably arranged in the vicinity of the terminals 62 in order to improve the noise removing effect. That is, in a case where the noise removing component is provided to the terminals 62 located at the rear-side region 52a, it is preferred that the noise removing component is placed adjacent to the respective terminals 62 on the first section 51 side of the terminals 62. Furthermore, in a case where the noise removing component is provided to the terminals 62 located at the front-side region 52b, it is preferred that the noise removing component is placed adjacent to the respective terminals 62 on the side of the terminals 62 which is opposite to the first section 51. At this time, since the magnetic sensing device 60 is mounted on the circuit board 50 such that the terminals 62 are located on the one side and the other side of the opening 55, even if the noise removing component(s) is mounted on the circuit board 50, it is possible to limit an increase in the width of the circuit board 50 in the width direction.

As shown in FIGS. 5 and 6, the circuit board 50, on which the magnetic sensing devices 60 are installed, is placed in the receiving recess 44 of the base body 41. Specifically, the circuit board 50 is placed such that the other surface 50b is opposed to a bottom surface of the receiving recess 44, and the second section 52 is placed at the one end portion of the sensor housing 40. Furthermore, the circuit board 50 is placed in the receiving recess 44 such that the recesses 54 are fitted to the projections 45 of the receiving recess 44, and the terminals 47 are inserted through the insertion holes 53. The circuit board 50 is fixed to the receiving recess 44 by electrically and mechanically connecting the circuit board 50 with the terminals 47 by, for example, soldering. The mechanical connection strength between the circuit board 50 and the sensor housing 40 may be improved by plastically deforming the projections 45 against the circuit board 50 by, for example, heat staking.

The first magnetic flux guide member 71 and the second magnetic flux guide member 72 are made of a soft magnetic material. In the present embodiment, as shown in FIG. 2, the first magnetic flux guide member 71 includes a main body 71a and a plurality of extensions 71b. The main body 71a is shaped in a rectangular strip form while a longitudinal direction of the rectangular strip coincides with the direction of the X-axis. The extensions 71b extend from the main body 71a in a direction intersecting the longitudinal direction of the main body 71a and are bent. Similarly, the second magnetic flux guide member 72 includes a main body 72a and a plurality of extensions 72b. The main body 72a is shaped in a rectangular strip form while a longitudinal direction of the rectangular strip coincides with the direction of the X-axis. The extensions 72b extend from the main body 72a in a direction intersecting the longitudinal direction of the main body 72a and are bent.

The number of the extensions 71b, 72b of each of the first and second magnetic flux guide members 71, 72 is set to coincide with the number of the magnetic sensing devices 60. Specifically, in the present embodiment, the number of the magnetic sensing devices 60 is two, so that the number of the extensions 71b, 72b of each of the first and second magnetic flux guide members 71, 72 is set be two.

Furthermore, in the present embodiment, the main body 71a of the first magnetic flux guide member 71 is fixed to a side surface of the receiving recess 44 by, for example, adhesive. In the first magnetic flux guide member 71, an end portion (hereinafter also referred to as a distal end portion) of each extension 71b, which is opposite from the main body 71a, is bent such that the end portion of the extension 71b is opposed to and approaches the main body 61 of the corresponding one of the magnetic sensing devices 60.

The second magnetic flux guide member 72 is opposed to the first magnetic flux guide member 71 in the axial direction and is fixed such that the main body 72a is fixed to a bottom surface of the receiving recess 44 by, for example, adhesive. In the second magnetic flux guide member 72, an end portion (hereinafter also referred to as a distal end portion) of each extension 72b, which is opposite from the main body 72a, is bent such that the end portion of the extension 72b is opposed to and approaches the main body 61 of the corresponding one of the magnetic sensing devices 60, and the end portion of the extension 72b is inserted into the opening 55. Specifically, the second magnetic flux guide member 72 is placed in the receiving recess 44 such that at least a portion of the second magnetic flux guide member 72 is inserted into the opening 55.

In this way, the magnetic sensor 30 is arranged such that the magnetic sensing devices 60 are placed between the first magnetic flux guide member 71 and the second magnetic flux guide member 72. The distal end portion of each extension 71b of the first magnetic flux guide member 71 and the distal end portion of each extension 72b of the second magnetic flux guide member 72 may be respectively spaced from the main body 61 of the corresponding magnetic sensing device 60 or may be joined to the main body 61 of the corresponding magnetic sensing device 60 by, for example, adhesive. Furthermore, each of the first and second magnetic flux guide members 71, 72 is arranged such that the main body 71a, 72a is placed at the one end portion of the sensor housing 40, and the extensions 71b, 72b extend toward the other end portion of the sensor housing 40.

The waterproof covering material 80, which integrally covers and fixes the circuit board 50, the magnetic sensing devices 60, the first magnetic flux guide member 71 and the second magnetic flux guide member 72, is arranged at the receiving recess 44. In this way, exposure of the circuit board 50 and the like to water can be limited, and a change in the positional relationship among the magnetic sensing devices 60, the first magnetic flux guide member 71 and the second magnetic flux guide member 72 can be limited. Thus, occurrence of a failure or deterioration in the sensing accuracy can be limited. The covering material 80 is made of, for example, epoxy resin.

Figure 8:
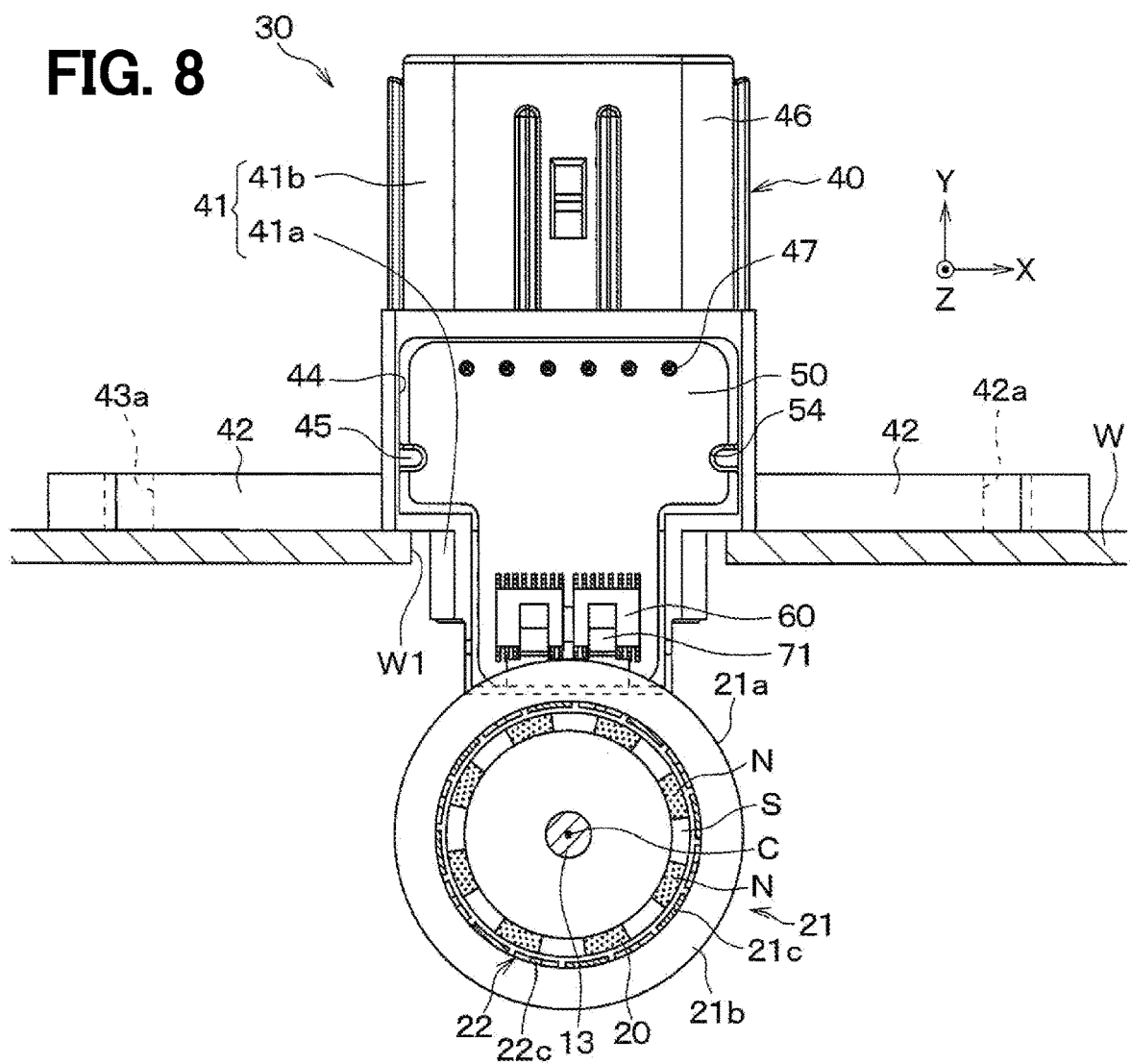
FIG. 8 is a schematic diagram of the torque sensing device where the magnetic sensor is installed to the receiving wall according to the first embodiment.

The structure of the magnetic sensor 30 of the present embodiment has been described. In the case where the magnetic sensor 30 is used in the torque sensing device 10, the one end portion of the sensor housing 40 is placed to face the first magnetic circuit portion 21 and the second magnetic circuit portion 22. Specifically, as shown in FIG. 8, the multipole magnet 20, the first magnetic circuit portion 21 and the second magnetic circuit portion 22 are received on an inner side of a receiving wall W.

In the present embodiment, the receiving wall W is a wall material that forms a casing of the electric power steering apparatus 1 shown in FIG. 1. The receiving wall W rotatably supports and covers the first shaft 11 and the second shaft 12. The receiving wall W has the installation hole W1 which is a through-hole. Furthermore, in FIG. 8, in order to avoid complication of the illustration and to facilitate understanding, the first magnetic circuit portion 21 and the second magnetic circuit portion 22 are shown in a simplified form, and the N-poles, the torsion bar 13 and the first-side teeth 21c are indicated with hatching. Further, in each corresponding drawing described later, in order to avoid complication of the illustration and to facilitate understanding, the first magnetic circuit portion 21 and the second magnetic circuit portion 22 are shown in the simplified form, and the N-poles, the torsion bar 13 and the first-side teeth 21c are indicated with hatching.

The magnetic sensor 30 is fixed to the receiving wall W such that the front-side portion 41a of the sensor housing 40 is inserted into the inside of the receiving wall W through the installation hole W1. Specifically, the magnetic sensor 30 is arranged such that lower end surfaces of the first and second flanges 42, 43 contact an outer wall surface (an upper surface in FIG. 8) of the receiving wall W which is located around the installation hole W1. The magnetic sensor 30 is fixed to the receiving wall W when the magnetic sensor 30 is fixed to the receiving wall W with, for example, bolts (not shown) installed through the fixation holes 42a, 43a. The magnetic sensor 30 is inserted into the installation hole W1 in the direction of the Y-axis (serving as an inserting direction). Therefore, it can be said that the sensor housing 40 is formed such that the width of the front-side portion 41a is smaller than the width of the rear-side portion 41b in the direction which intersects the inserting direction of the magnetic sensor 30.

Figure 11:
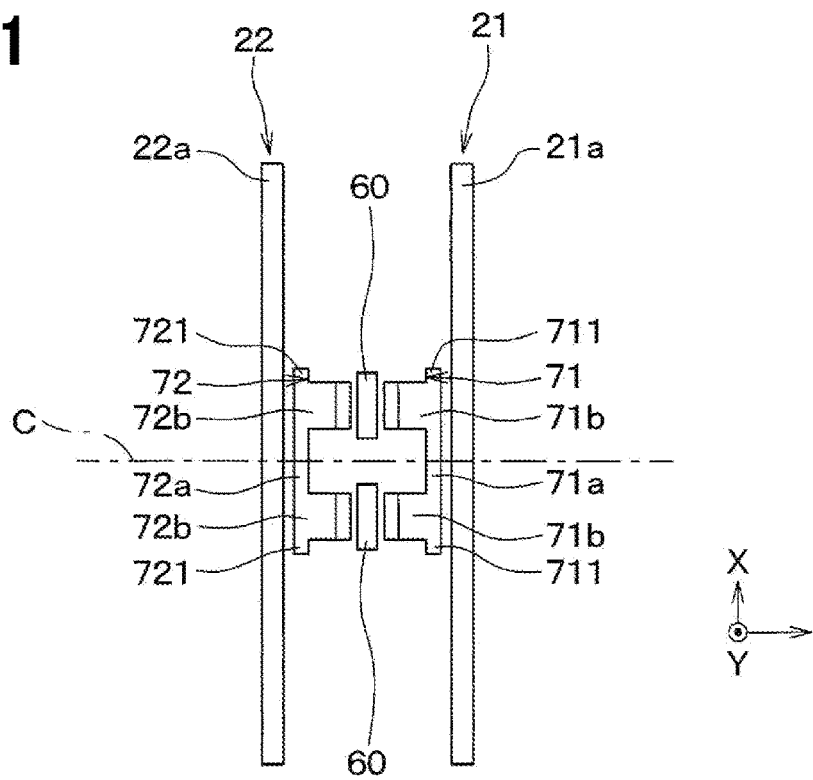
FIG. 11 is a plan view seen in a direction XI in FIG. 10.

At this time, the magnetic sensor 30 is arranged such that the first magnetic flux guide member 71 is magnetically coupled to the first magnetic circuit portion 21, and the second magnetic flux guide member 72 is magnetically coupled to the second magnetic circuit portion 22. In the present embodiment, the magnetic sensor 30 is arranged such that the first magnetic flux guide member 71 is opposed to the first magnetic circuit portion 21 in the axial direction, and the second magnetic flux guide member 72 is opposed to the second magnetic circuit portion 22 in the axial direction. As shown in FIG. 11, each of the first and second magnetic flux guide members 71, 72 is arranged such that the main body 71a, 72a is opposed to and is spaced by a predetermined gap relative to the corresponding one of the first and second magnetic circuit portions 21, 22 on the inner side the corresponding one of the first and second magnetic circuit portions 21, 22 in the axial direction.

As described above, when the torsional torque is generated at the torsion bar 13, a magnetic flux, which corresponds to this torsional torque, is generated between the first and second magnetic circuit portions 21, 22. This magnetic flux is guided to the magnetic sensing devices 60 through the first and second magnetic flux guide members 71, 72.

Therefore, an electrical signal, which corresponds to this magnetic flux, is outputted from the magnetic sensing devices 60.

Here, in the torque sensing device 10 described above, when the multipole magnet 20 and the first and second magnetic circuit portions 21, 22 are rotated synchronously, the magnetic flux, which passes the magnetic circuit, periodically fluctuates. This periodic fluctuation becomes a noise against the electrical signal outputted from the magnetic sensing device 60. Hereinafter, the noise, which periodically changes, will be referred to as a whirl noise, and this whirl noise will be described.

A flow of the magnetic flux from the first-side teeth 21c to the first ring plate 21b at the first magnetic circuit portion 21 will be described with reference to FIG. 9. Since a flow of the magnetic flux from the second-side teeth 22c to the second ring plate 22b at the second magnetic circuit portion 22 is the same as that of the first magnetic circuit portion 21, the detailed description of the flow of the magnetic flux from the second-side teeth 22c to the second ring plate 22b at the second magnetic circuit portion 22 will be omitted.

Figure 9:
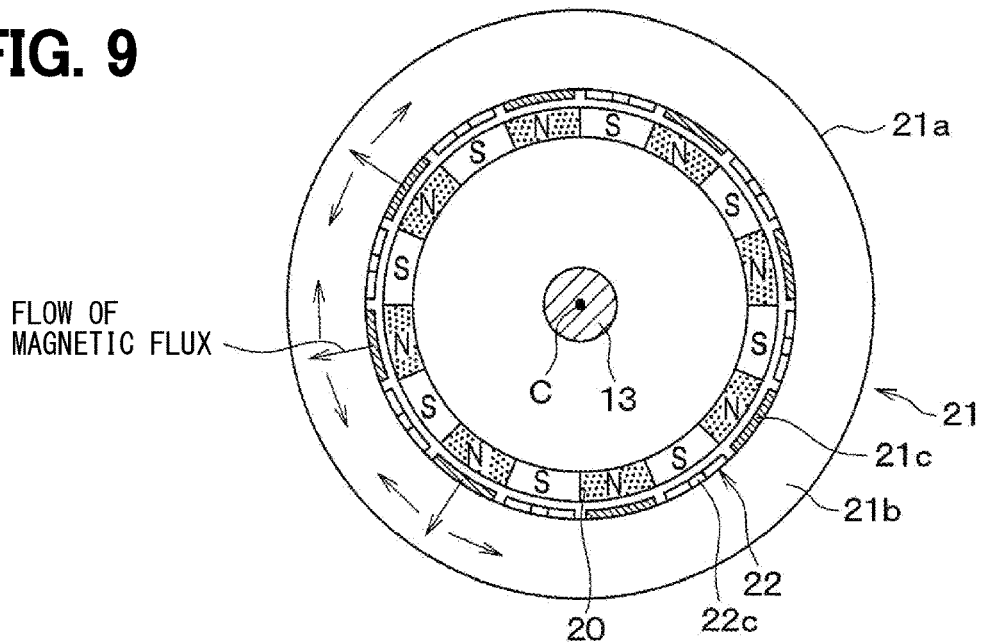
FIG. 9 is a diagram for describing a flow of a magnetic flux from first-side teeth to a first ring plate according to the first embodiment.

As shown in FIG. 9, a magnetic flux density changes according to a distance between the multipole magnet 20, which serves as a magnetic flux source, and the first-side teeth 21c of the first magnetic circuit portion 21, which faces the multipole magnet 20. The magnetic flux density at the first magnetic circuit portion 21 becomes high at a location near the first-side teeth 21c and becomes low at a location remote from the first-side teeth 21c.

Therefore, in the case where the multipole magnet 20 and the first magnetic circuit portion 21 are rotated synchronously, when the magnetic sensing device 60 is opposed to a specific part of the first ring plate 21b at the first magnetic circuit portion 21, the fluctuation of the magnetic flux generated in response to the rotation is sensed by the magnetic sensing device 60. Furthermore, in response to the rotation, the leaked magnetic flux, which is leaked between the first-side teeth 21c and the second-side teeth 22c, is added, so that the fluctuation of the magnetic flux becomes large. This is sensed by the magnetic sensing device 60 as the whirl noise. When the signal, which is sensed by the magnetic sensing device 60, becomes relatively large, an SN ratio, which is a ratio between the signal and the noise, is reduced.

Figure 10:
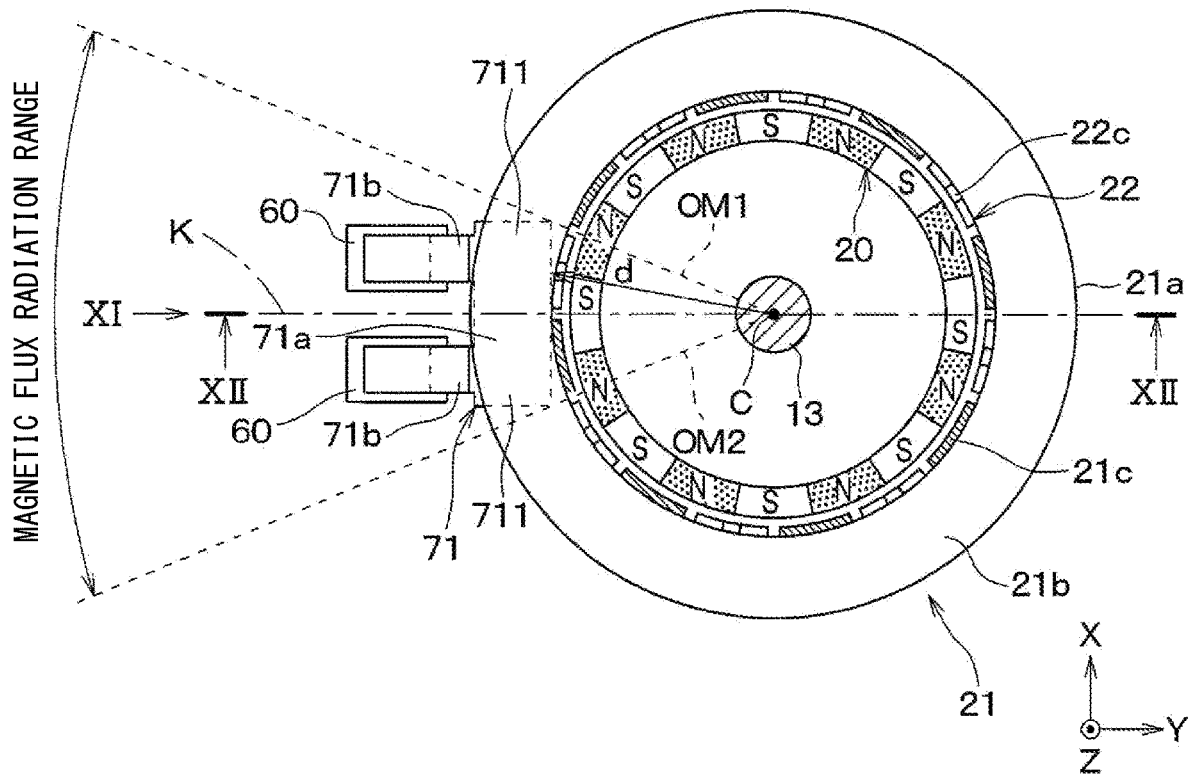
FIG. 10 is a diagram indicating a positional relationship between a first magnetic flux guide member and a first magnetic circuit portion according to the first embodiment.
Figure 12:
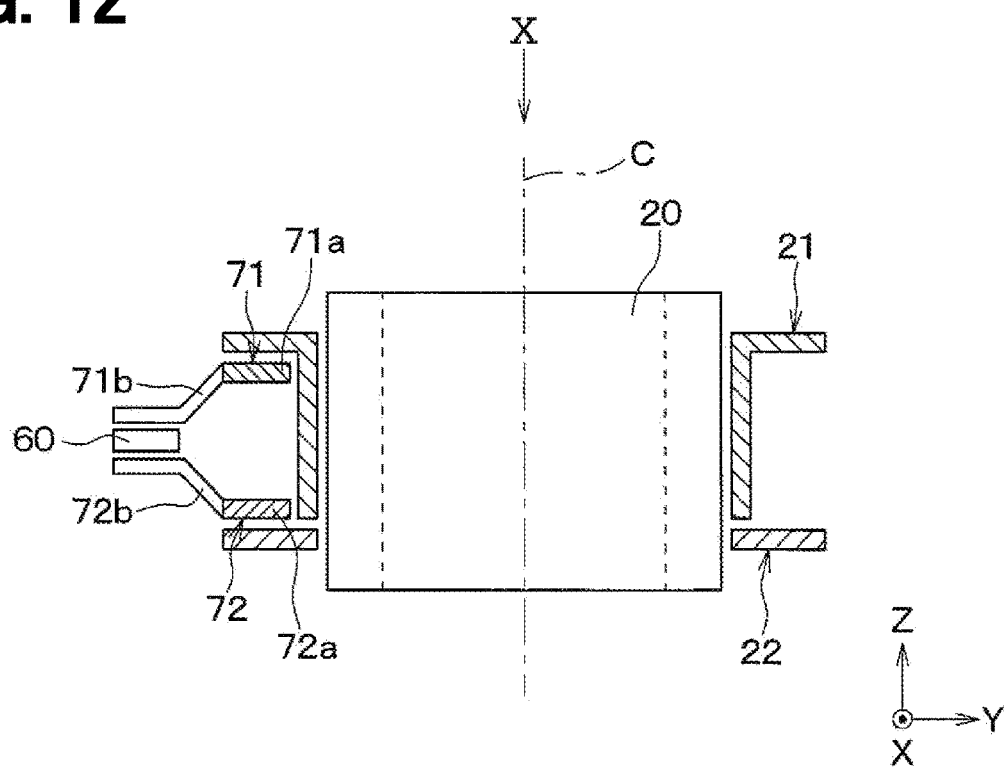
FIG. 12 is a cross-sectional view taken along line XII-XII in FIG. 10.

Therefore, in the present embodiment, the SN ratio can be improved by limiting the whirl noise. Hereinafter, a specific structure, which improves the SN ratio, will be described with reference to FIGS. 10 to 12. FIG. 10 corresponds to a plan view seen in a direction X in FIG. 12. Furthermore, FIG. 10 shows a neutral state where a torsional displacement is not applied to the torsion bar 13. Each of the drawings, which correspond to FIG. 10 and described later, shows the neutral state where the torsional displacement is not applied to the torsion bar 13.

First of all, in each of the first and second magnetic flux guide members 71, 72 of the present embodiment, the main body 71a, 72a is shaped in the rectangular strip form, as described above. As shown in FIG. 10, in the state where the magnetic sensor 30 is installed to the receiving wall W, in the axial view, an imaginary line, which is perpendicular to the rotational axis C and intersects the center location of the main body 71a, 72a of each of the first and second magnetic flux guide members 71, 72, is defined as a reference line K. More specifically, in the axial view, the imaginary line, which is perpendicular to the rotational axis C and intersects the center location between the two magnetic sensing devices 60, is defined as the reference line K. The first and second magnetic flux guide members 71, 72 are arranged such that two opposed long sides of each of the first and second magnetic flux guide members 71, 72 extend perpendicular to the reference line K.

Furthermore, the extensions 71b, 72b of each of the first and second magnetic flux guide members 71, 72 are arranged symmetrically with respect to the reference line K. Therefore, the two magnetic sensing devices 60, each of which is placed between the corresponding two of the extensions 71b, 72b, are also arranged symmetrically with respect to the reference line K. Thus, the magnetic flux is also guided from the first and second magnetic flux guide members 71, 72 to each of the magnetic sensing devices 60.

As described above, each of the first and second magnetic flux guide members 71, 72 is arranged such that the main body 71a, 72a is placed at the one end portion side of the sensor housing 40, and the extensions 71b, 72b extend toward the other end portion side of the sensor housing 40. Therefore, in the state where the magnetic sensor 30 is installed to the receiving wall W, the extensions 71b, 72b extend in a radial direction (hereinafter also simply referred to as the radial direction) at the first and second magnetic circuit portions 21, 22.

Furthermore, in the first magnetic flux guide member 71, a pair of end portions of the main body 71a, between which the reference line K is interposed, will be referred to as a pair of outer end portions 711. Similarly, in the second magnetic flux guide member 72, a pair of end portions of the main body 72a, between which the reference line K is interposed, will be referred to as a pair of outer end portions 721. Furthermore, the outer end portions 711, 721 of each of the first and second magnetic flux guide members 71, 72 can be also said to be two circumferential end portions of the main body 71a, 72a in the circumferential direction of the first and second magnetic circuit portions 21, 22. Furthermore, the first magnetic flux guide member 71 and the second magnetic flux guide member 72 are identically formed and are arranged symmetrically with respect to an imaginary plane that extends through the two magnetic sensing devices 60.

In the present embodiment, the main body 71a, 72a of each of the first and second magnetic flux guide members 71, 72 is shaped in the rectangular strip form. Therefore, a distance d measured between the main body 71a, 72a and the rotational axis C is set such that the distance d measured at each of the pair of outer end portions 711, 721 is longer than the distanced measured at an intermediate portion of the main body 71a, 72a circumferentially located between the pair of outer end portions 711, 721.

In the axial view, an imaginary line, which radially connects a radially inner side part (the rotational axis C side part) of one of the pair of outer end portions 711, 721 to the rotational axis C, will be referred to as an imaginary line OM1, and an imaginary line, which radially connects a radially inner side part (the rotational axis C side part) of the other one of the pair of outer end portions 711, 721 to the rotational axis C, will be referred to as an imaginary line OM2. More specifically, a radially inner side part (the rotational axis C side part) of an end of the one outer end portion 711, which is circumferentially opposite to the reference line K, is connected to the rotational axis C by the imaginary line OM1, and a radially inner side part (the rotational axis C side part) of an end of the other outer end portion 711, which is circumferentially opposite to the reference line K, is connected to the rotational axis C by the imaginary line OM2. A circumferential range, which is defined between the two imaginary lines OM1, OM2 in the circumferential direction (i.e., the circumferential direction of the first shaft 11), is defined as a magnetic flux radiation range (or simply referred to as a radiation range), and one or more of the magnetic poles of the multipole magnet 20 is placed in the magnetic flux radiation range. The number of the one or more of the magnetic poles placed in the multipole magnet 20 will be referred to as the number of magnetic poles in the radiation range. In this case, in the example shown in FIG. 10, the number of magnetic poles in the radiation range is 2.0.

Figure 13:
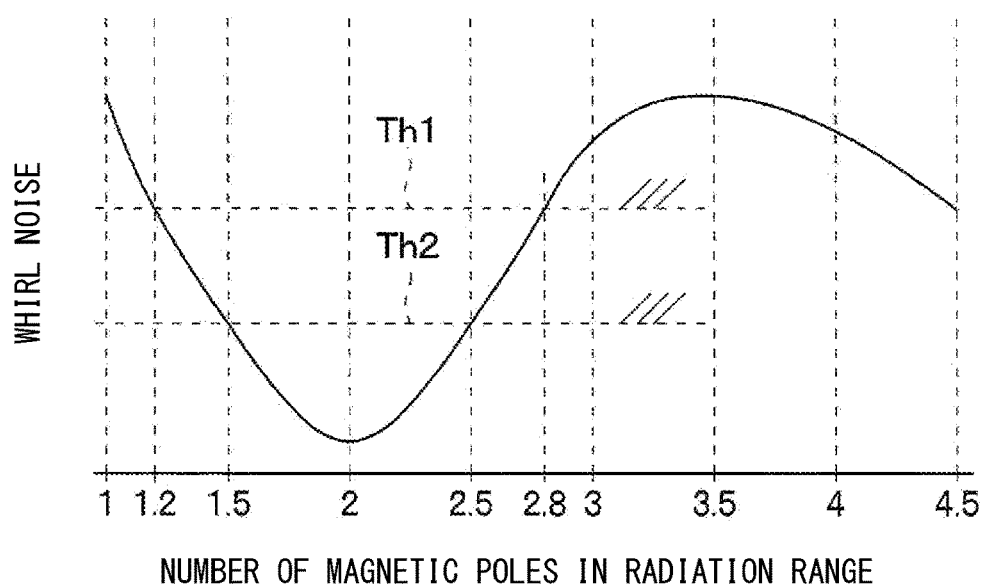
FIG. 13 is a diagram indicating a result of a simulation with respect a relationship between the number of magnetic poles of the multipole magnet in a magnetic flux radiation range and a whirl noise in a case where the total number of the magnetic poles of the multipole magnet is 16.

The inventors of the present application have studied a relationship between the number of magnetic poles in the radiation range and the whirl noise and have obtained a simulation result shown in FIG. 13. Specifically, as shown in FIG. 13, it is confirmed that the whirl noise decreases as the number of magnetic poles in the radiation range increases from 1.0, and the whirl noise becomes minimum when the number of magnetic poles is about 2.0. It is also confirmed that the whirl noise increases as the number of magnetic poles in the radiation range increases from 2.0 to 3.0.

In this case, a permissible threshold value of the whirl noise is set to Th1, and the whirl noise is below the permissible threshold value Th1 when the number of the magnetic poles in the radiation range is in a range of 1.2 to 2.8. Here, it is assumed that the permissible threshold value Th1 is 300 µT which is permissible as a general whirl noise. Therefore, it is desirable that the first and second magnetic flux guide members 71, 72 are configured to have the number of magnetic poles in the radiation range in the range of 1.2 to 2.8.

Furthermore, in a case where the permissible threshold value of the whirl noise is set to Th2 that is lower than Th1, the whirl noise becomes below the permissible threshold value Th2 when the number of magnetic poles in the radiation range is in a range of 1.5 to 2.5. Here, it is assumed that the permissible threshold value Th2 is 170 µT which is recognized as a sufficiently low whirl noise in general. Therefore, in the range where the number of magnetic poles in the radiation range is 1.5 to 2.5, the effect of reducing the whirl noise can be further increased. Particularly, when the number of magnetic poles in the radiation range is 2.0, the effect of reducing the whirl noise can be maximized.

Therefore, in the present embodiment, the first and second magnetic flux guide members 71, 72 are configured to have the number of magnetic poles in the radiation range in the range of 1.2 to 2.8. It is further preferred that the first and second magnetic flux guide members 71, 72 are configured to have the number of magnetic poles in the radiation range in the range of 1.5 to 2.5.

As described above, in the present embodiment, the circuit board 50 includes the rear-side region 52*a* and the front-side region 52*b* which are respectively located on the one side and the other side of the opening 55. The magnetic sensing device 60 is installed to the circuit board 50 such that the terminals (front-side terminals) 62 are located at the front-side region 52*b*, and the other terminals (rear-side terminals) 62 are located at the rear-side region 52*a*. Therefore, it is possible to limit an increase in the length (width) of the circuit board 50 in the width direction and an increase in the length (width) of the sensor housing 40 in the width direction. That is, it is possible to limit an increase in the length (width) of the magnetic sensor 30 in the direction intersecting the inserting direction at the time of forming the torque sensing device 10. Since an increase in the size of the sensor housing 40 in the width direction is limited, it is possible to reduce a diameter (size) of the installation hole W1 at the time of forming the torque sensing device 10. Thus, it is possible to reduce the size of the installation space.

Furthermore, in the present embodiment, the circuit board 50 is shaped in the flat convex form (stepped form). The sensor housing 40 is shaped in the flat convex form (stepped form) which corresponds to the shape of the circuit board 50. Therefore, the length (width) of the front-side portion 41*a* in the width direction can be reduced at the sensor housing 40.

Figure 14:
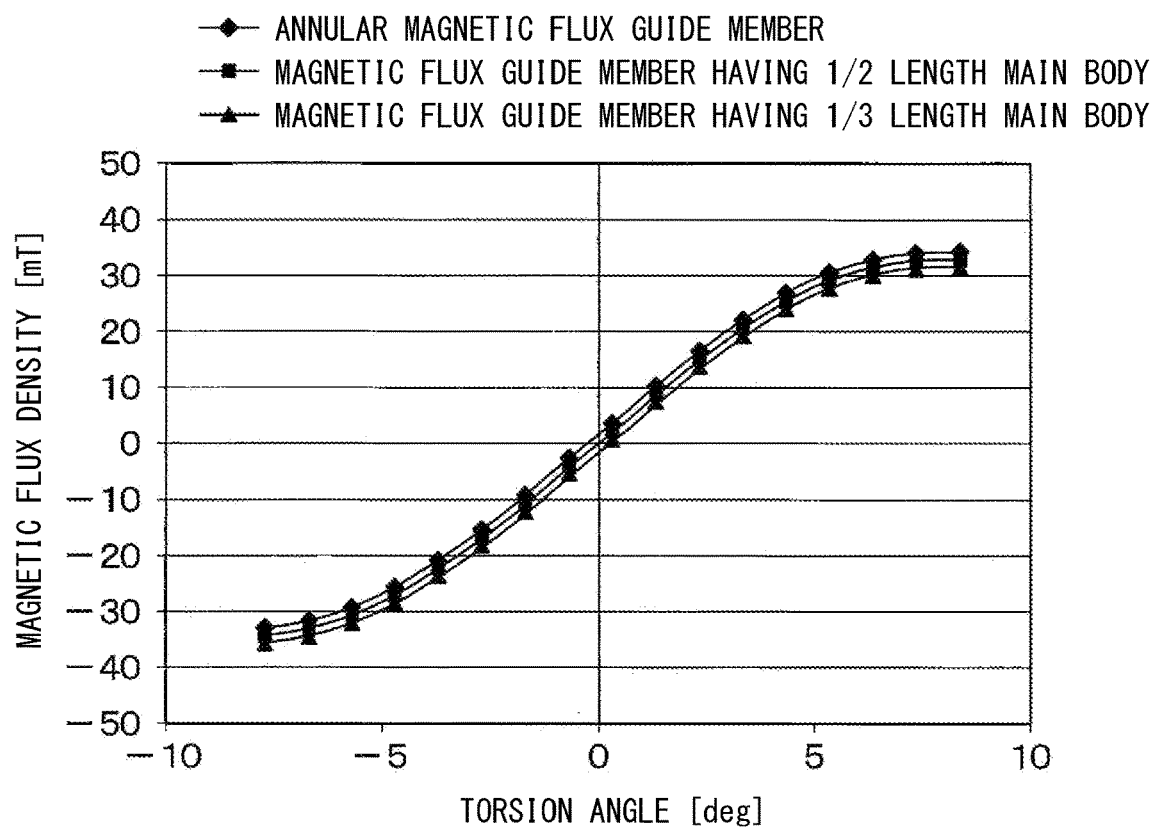
FIG. 14 is a diagram indicating a result of a simulation with respect a relationship between a torsion angle of a torsion bar and a magnetic flux density of a magnetic flux passing through a magnetic sensing device.

Furthermore, each of the first and second magnetic flux guide members 71, 72 is formed such that the extensions 71*b*, 72*b* are provided to the main body 71*a*, 72*a*, which has the pair of outer end portions 711, 721. Therefore, in comparison to an ordinary device where each of the first and second magnetic flux guide members 71, 72 are shaped in an annular form, it is possible to reduce the amount of material of the first and second magnetic flux guide members 71, 72. In this case, according to the study of the inventors of the present application, as shown in FIG. 14, it is found that the density of the magnetic flux, which is guided by the first and second magnetic flux guide members 71, 72, does not substantially change even when the size of the first and second magnetic flux guide members 71, 72 is changed. Furthermore, "a magnetic flux guide member having ½ length main body" shown in FIG. 14 is a magnetic flux guide member, in which a length of the main body 71*a*, 72*a* measured in the longitudinal direction is set to ½ of a circumferential length of an annular magnetic flux guide member. Similarly, "a magnetic flux guide member having ⅓ length main body" shown in FIG. 14 is a magnetic flux guide member, in which a length of the main body 71*a*, 72*a* measured in the longitudinal direction is set to ⅓ of the circumferential length of the annular magnetic flux guide member.

In the case where the first and second magnetic flux guide members 71, 72 is shaped in the annular form, the first and second magnetic flux guide members 71, 72 extend all around the second shaft 12 in the circumferential direction. However, in the present embodiment, since the first and second magnetic flux guide members 71, 72 are not shaped in the annular form, the first and second magnetic flux guide members 71, 72 do not extend all around the second shaft 12 in the circumferential direction. Therefore, it is not necessary to consider the second shaft 12 at the time of attaching and detaching the first and second magnetic flux guide members 71, 72, and thereby the replacement of the components can be easily performed.

The first and second magnetic flux guide members 71, 72 are configured to have the corresponding number of magnetic poles in the radiation range which allows the reduction in the whirl noise. Therefore, the whirl noise can be reduced, and the SN ratio of the magnetic sensing device 60 can be improved.

Furthermore, the sensor housing 40 is provided with the waterproof covering material 80, which integrally seals the circuit board 50, the magnetic sensing devices 60 and the first and second magnetic flux guide members 71, 72. Therefore, it is possible to improve the waterproof performance for protecting these components from the water.

Modifications of First Embodiment

Modifications of the first embodiment will now be described. In the first embodiment, there is described the case where the total number of magnetic poles of the multipole magnet 20 is 16. However, the total number of magnetic poles of the multipole magnet 20 may be appropriately changed. For example, the total number of magnetic poles of the multipole magnet 20 may be set to 20.

Figure 15:
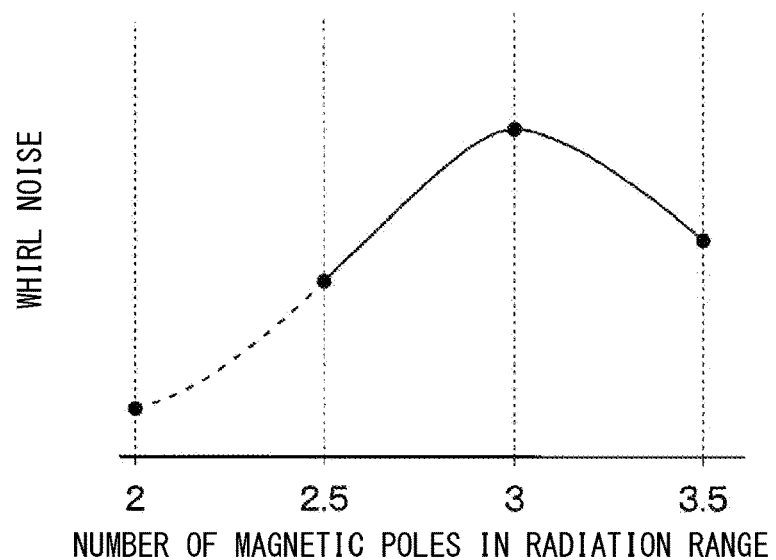
FIG. 15 is a diagram indicating a result of a simulation in a modification of the first embodiment with respect a relationship between the number of magnetic poles of the multipole magnet in a magnetic flux radiation range and a whirl noise in a case where the total number of the magnetic poles of the multipole magnet is twenty.

In such a case, as shown in FIG. 15, under the premise that the magnetic sensing devices 60, which have the same size as those of the first embodiment, is used, it becomes difficult to have the required configuration of the first and second magnetic flux guide members 71, 72 when the number of magnetic poles in the radiation range becomes equal to or smaller than 2.5. However, in a case where the magnetic sensing devices 60 having a smaller size are used, the whirl noise can be reduced when the number of magnetic poles in the radiation range is in the range of 2.0 to 2.5 as indicated by a dotted line in FIG. 15 like in the case where the number of magnetic poles is 16. Therefore, even when the total number of magnetic poles of the multipole magnet 20 is changed in the above described manner, the whirl noise can be reduced when the number of magnetic poles in the radiation range approaches 2.0.

Second Embodiment

A second embodiment will be described. The second embodiment is a modification of the first embodiment in which a shield member is added. The rest of the present embodiment is the same as that of the first embodiment and will not be described here.

Figure 16:
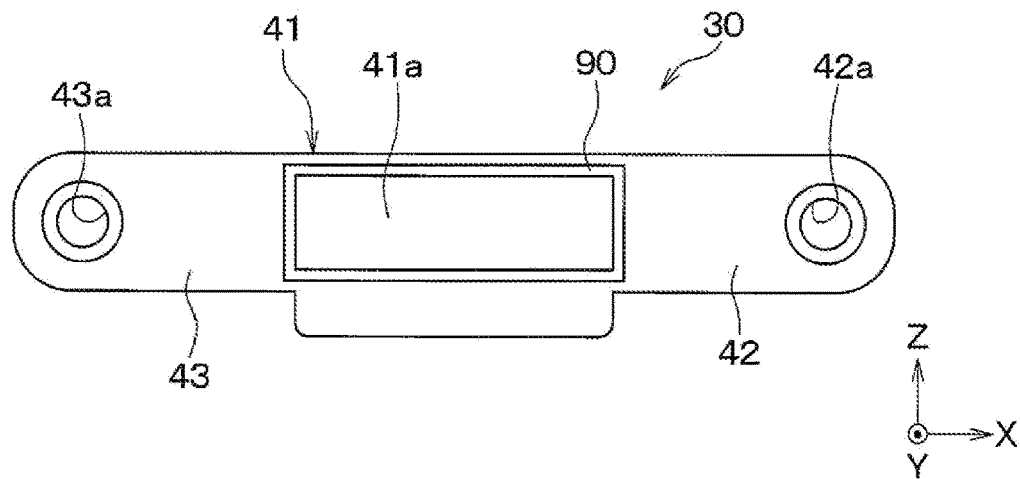
FIG. 16 is a plan view of a magnetic sensor according to a second embodiment.
Figure 17:
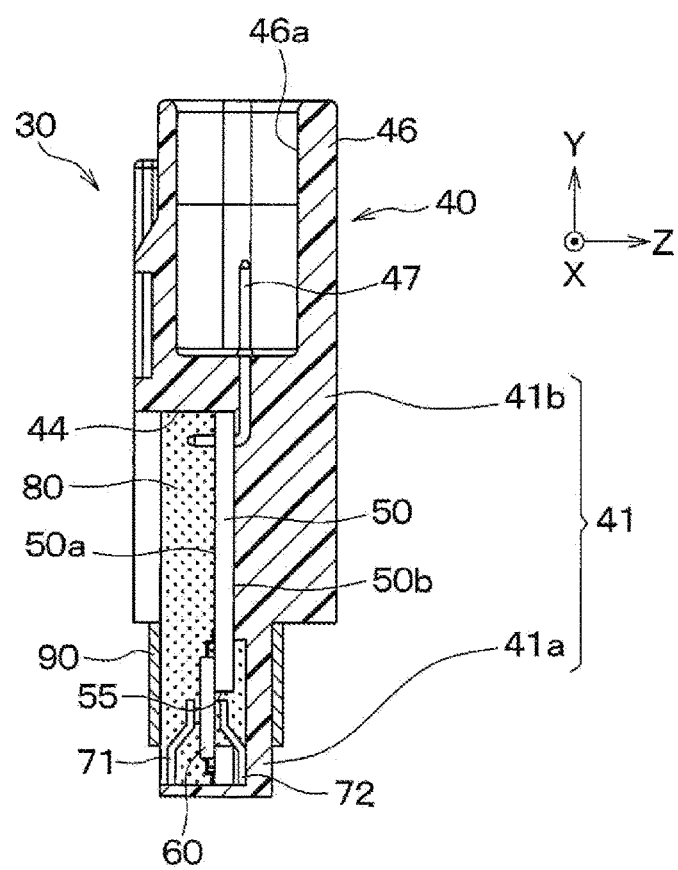
FIG. 17 is a cross-sectional view of the magnetic sensor according to the second embodiment.

In the present embodiment, as shown in FIGS. 16 and 17, the shield member 90, which is shaped in a tubular form and is made of a soft magnetic material, is provided to the front-side portion 41*a* of the base body 41. Specifically, the shield member 90 is shaped in a rectangular tubular form that corresponds to the outer shape of the front-side portion 41*a*. The shield member 90 surrounds the magnetic sensing devices 60 all around the axis that is parallel to the Y-axis. In the present embodiment, the shield member 90 is fixed to the base body 41 by, for example, adhesive. FIG. 16 is a plan view of the magnetic sensor 30 seen from the one end portion side (lower side) in FIG. 5. Furthermore, FIG. 17 is a cross-sectional view that indicates the sensor housing 40 and corresponds to the cross-sectional view taken along line VI-VI in FIG. 5.

As shown in FIGS. 16 and 17, the shield member 90 is arranged to surround the magnetic sensing device 60. Therefore, the shield member 90 can limit the external magnetic field from reaching the magnetic sensing devices 60. As a result, it is possible to limit a deterioration in the sensing accuracy.

As long as the shield member 90 is arranged at the front-side portion 41*a* of the base body 41 as described above, the shield member 90 may be integrated with the front-side portion 41*a* by insert molding or the like. Furthermore, the shield member 90 may be fixed to the front-side portion 41*a* by, for example, press-fitting. In such a case, the front-side portion 41*a* of the base body 41 may have, for example, a tapered form that has the width which progressively increases toward the rear-side portion 41*b*.

Third Embodiment

A third embodiment will be described. The present embodiment differs from the first embodiment with respect to that a rack-type electric power steering apparatus is provided instead of the column-type electric power steering apparatus, and a cap and a sealing material are added. The rest of the present embodiment is the same as that of the first embodiment and will not be described here.

Figure 18:
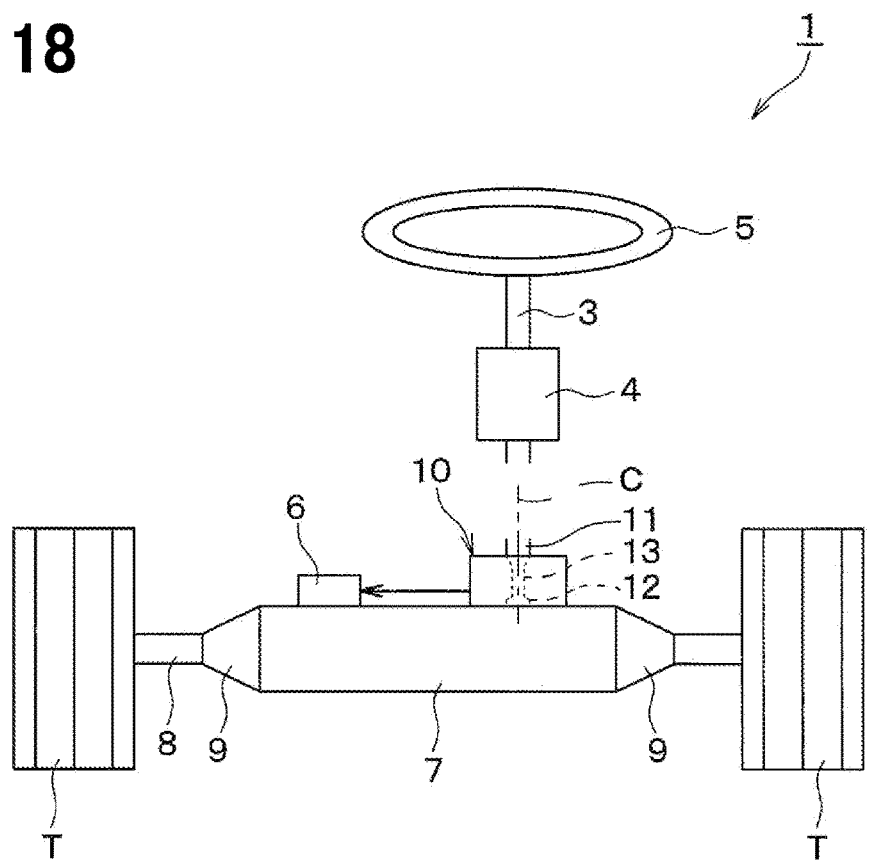
FIG. 18 is a schematic diagram showing a structure of an electric power steering apparatus having a torque sensing device according to a third embodiment.

As shown in FIG. 18, the rack-type electric power steering apparatus 1 of the present embodiment includes a steering shaft 3, a steering column 4 and the steering wheel 5. Furthermore, the rack-type electric power steering apparatus 1 includes the electric motor 6, the steering gear mechanism 7, the link mechanisms 8, two rubber boots 9 and the torque sensing device 10. Although the steering shaft 3, the steering column 4 and the rubber boots 9 are also provided at the column-type electric power steering apparatus 1 shown in FIG. 1, the indication of these components along with the reference signs is omitted in FIG. 1 for the sake of simplicity.

The steering shaft 3 is rotatably supported by the steering column 4. One end portion of the steering shaft 3 is coupled to the steering wheel 5 and is rotated in response to the operation of the steering wheel 5.

The electric motor 6 is operated according to the operational state of the steering wheel 5 and provides an assist force for assisting the steering force for changing the orientation of the wheels T to the steering gear mechanism 7. As shown in FIG. 18, in the rack-type electric power steering apparatus 1, the electric motor 6 is installed to a casing of the steering gear mechanism 7. As described above, in the column-type electric power steering apparatus 1 shown in FIG. 1, the electric motor 6 is installed to the steering column 4.

The rubber boots 9 are respectively installed to two opposite end portions of the steering gear mechanism 7 which are respectively connected to the link mechanisms 8. The rubber boots 9 are provided to limit intrusion of the water into the inside of the steering gear mechanism 7 through connections of the steering gear mechanism 7 which are respectively connected to the link mechanisms 8.

In the rack-type electric power steering apparatus 1, the torque sensing device 10 is installed to the casing of the steering gear mechanism 7. In the column-type electric power steering apparatus 1 shown in FIG. 1, the torque sensing device 10 is installed to the steering column 4. Specifically, in the column-type electric power steering apparatus 1 shown in FIG. 1, the receiving wall W is the wall material that forms the casing of the steering column 4. In contrast, in the rack-type electric power steering apparatus 1, the receiving wall W is the wall material that forms the casing of the steering gear mechanism 7.

In the rack-type electric power steering apparatus 1, the torque sensing device 10 is provided at the installation height that is substantially the same as the installation height of the rubber boots 9. Therefore, in the rack-type electric power steering apparatus 1, the torque sensing device 10 is more likely to be in an environment, which has a high risk of being exposed to the water, than the column-type electric power steering apparatus 1. Specifically, the water is likely to intrude from the outside into the inside of the receiving wall W through a location between the magnetic sensor 30 and the receiving wall W.

In this way, the sealing performance for sealing between the magnetic sensor 30 and the receiving wall W can be improved. Specifically, the water is less likely to intrude from the outside into the inside of the receiving wall W through a location between the magnetic sensor 30 and the receiving wall W.

Figure 19:
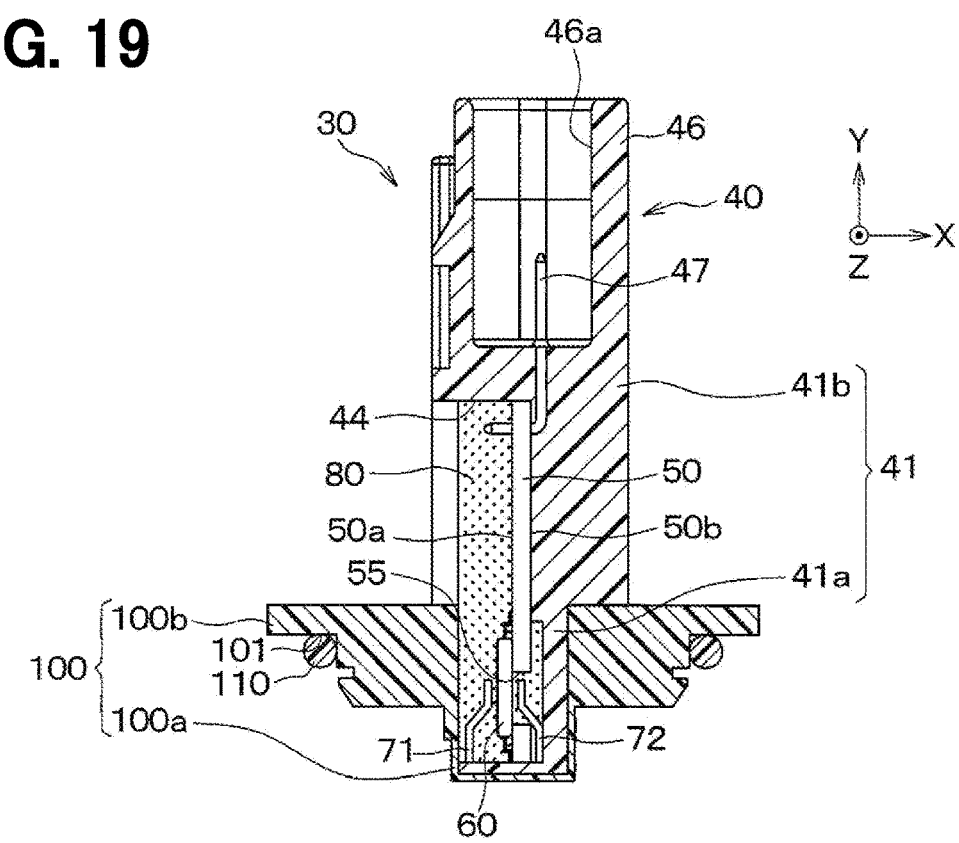
FIG. 19 is a cross-sectional view of a magnetic sensor according to the third embodiment.

Specifically, as shown in FIG. 19, the magnetic sensor 30 of the present embodiment has a cap 100 provided to the front-side portion 41*a* of the sensor housing 40. Like the sensor housing 40, the cap 100 is formed by molding dielectric synthetic resin with a molding die. The cap 100 of the present embodiment includes a bottom portion 100*a* and a flange 100b. The bottom portion 100a is shaped in a bottomed rectangular tubular form that corresponds to the outer shape of the one end portion side of the sensor housing 40. The flange 100b is shaped in a circular ring form. The cap 100 has a groove 101 that is formed at an outer peripheral wall surface (or simply referred to as an outer wall surface) of the flange 100b such that the groove 101 circumferentially extends about an axis that is parallel to the Y-axis. An O-ring, which is a sealing material 110, is installed in the groove 101. Furthermore, FIG. 19 is a cross-sectional view that indicates the sensor housing 40 and corresponds to the cross-sectional view taken along line VI-VI in FIG. 5.

Figure 20:
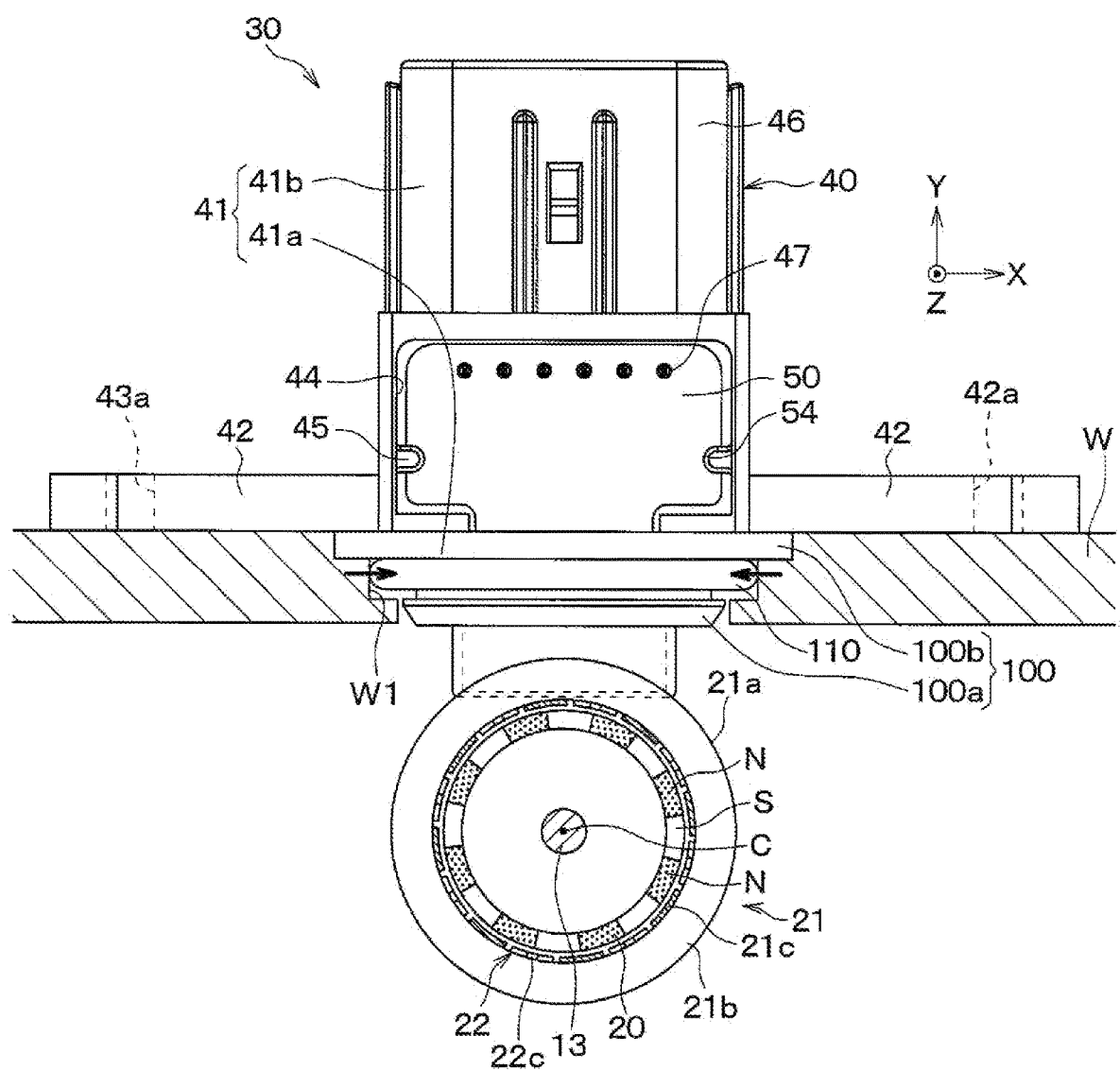
FIG. 20 is a schematic diagram of the torque sensing device where the magnetic sensor is installed to the receiving wall according to the third embodiment.

The structure of the magnetic sensor 30 of the present embodiment has been described. With reference to FIG. 20, when the magnetic sensor 30, which is constructed in the above-described manner, is installed to the receiving wall W, the sealing material 110 is installed to the receiving wall W as a shaft seal (i.e., a seal that is clamped between an outer peripheral surface of the tubular portion of the bottom portion 100a and an inner peripheral surface of the installation hole W1), as indicated by arrows in FIG. 20. Specifically, in the present embodiment, the installation hole W1 is formed at the receiving wall W such that the sealing material 110 functions as the shaft seal. In this way, the sealing performance for sealing between the magnetic sensor 30 and the receiving wall W can be improved.

As described above, in the present embodiment, the O-ring, which is the sealing material 110, is provided to the magnetic sensor 30. Therefore, at the time of installing the magnetic sensor 30 to the receiving wall W, the sealing performance for sealing between the magnetic sensor 30 and the receiving wall W can be improved by using the O-ring (the sealing material 110) as the shaft seal.

Furthermore, the magnetic sensor 30 includes the cap 100 provided to the base body 41, and the O-ring, which is the sealing material 110, is installed to the cap 100. Specifically, the O-ring, which is the sealing material 110, is installed to the cap 100 that is a component formed separately from the base body 41. Therefore, in comparison to a case where the O-ring, which is the sealing material 110, is directly installed to the sensor housing 40, the groove 101, into which the O-ring is installed, can be designed separately from the sensor housing 40, so that the designing of the groove 101 can be eased.

Furthermore, since the width of the front-side portion 41a of the sensor housing 40 is reduced as described above, a diameter of the flange 100b of the cap 100 can be also reduced. Therefore, the required amount of material of the sealing material 110 installed to the cap 100 can be reduced, and thereby the costs can be reduced.

Modification of Third Embodiment

Figure 21:
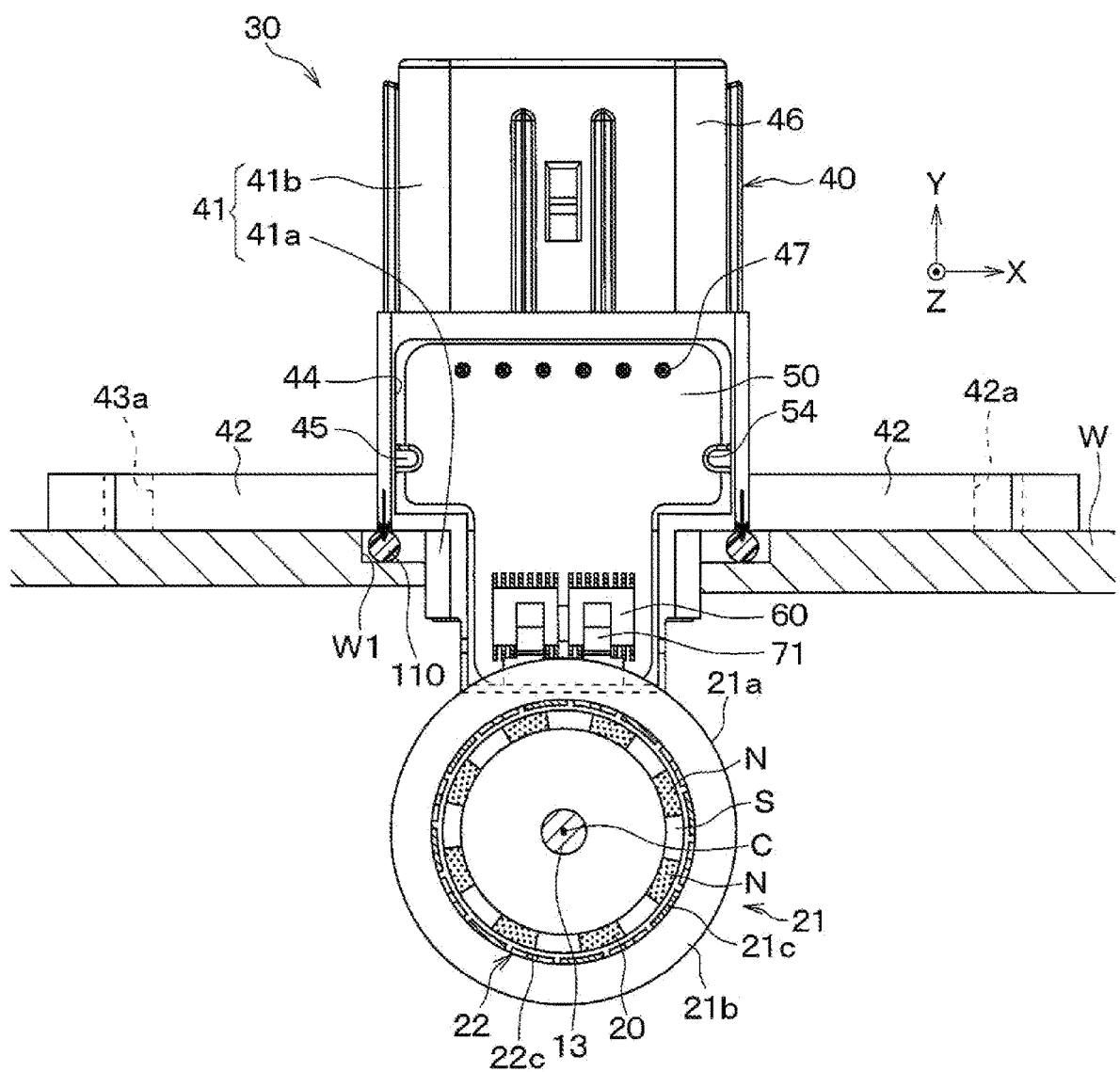
FIG. 21 is a schematic diagram of a torque sensing device where a magnetic sensor is installed to the receiving wall in a modification of the third embodiment.

A modification of the third embodiment will now be described. In the modification of the third embodiment, as shown in FIG. 21, the cap 100 is eliminated, and the sealing material 110 is installed between the front-side portion 41a of the sensor housing 40 and the receiving wall W. In the case where the sealing material 110 is arranged in the above-described manner, since the front-side portion 41a is shaped in the rectangular columnar form as described above, a sealing material, which is shaped in a rectangular frame form, is used as the sealing material 110. Furthermore, in the case of using this sealing material 110, a gap between the sensor housing 40 and the receiving wall W is sealed by a surface seal, in which the sealing material 110 is compressed in the axial direction as indicated by arrows in FIG. 21.

Since the compression load is applied more evenly by the shaft seal than the surface seal, the shaft seal can implement the higher sealing performance than the surface seal. Therefore, in order to improve the sealing performance between the magnetic sensor 30 and the receiving wall W, it is preferred that the cap 100 is provided to use the sealing material 110 as the shaft seal like in the third embodiment. Furthermore, in FIG. 21, the receiving wall W and the sealing material 110 are shown as a cross-sectional view for easy understanding.

Fourth Embodiment

A fourth embodiment will be described. The present embodiment is a combination of the second embodiment and the third embodiment. The rest of the present embodiment is the same as that of the first embodiment and will not be described here.

Figure 22:
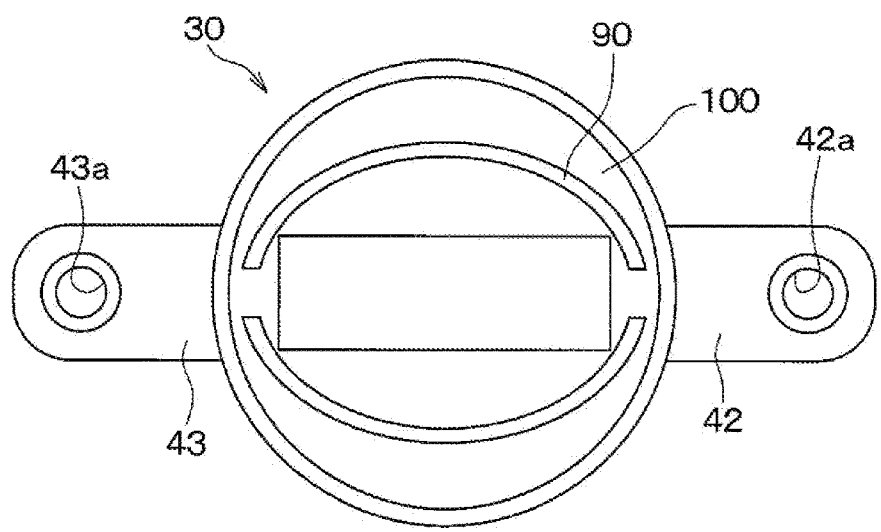
FIG. 22 is a plan view of a magnetic sensor according to a fourth embodiment.
Figure 23:
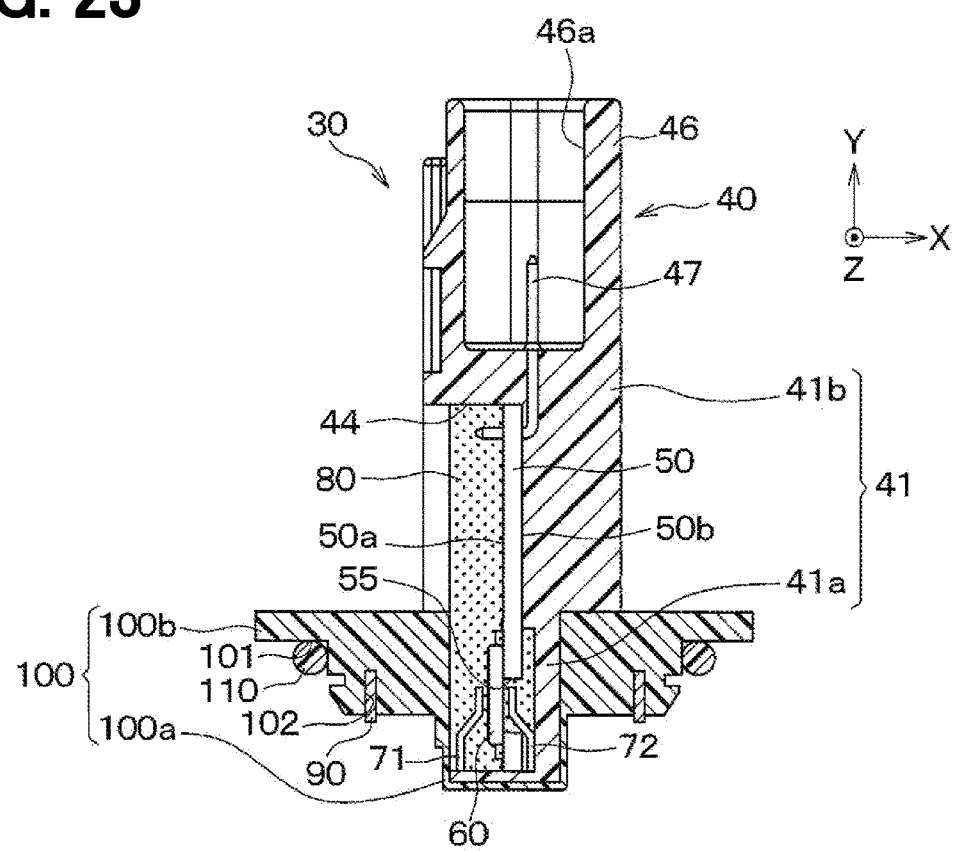
FIG. 23 is a cross-sectional view of the magnetic sensor according to the fourth embodiment.

In the present embodiment, as shown in FIGS. 22 and 23, the shield member 90 is provided to the cap 100. Specifically, a receiving groove 102 is formed at the flange 100b of the cap 100. The shield member 90 is fitted into the receiving groove 102, so that the shield member 90 is fixed to the cap 100. FIG. 22 is a plan view of the magnetic sensor 30 seen from the one end portion side. Furthermore, FIG. 23 is a cross-sectional view that indicates the sensor housing 40 and corresponds to the cross-sectional view taken along line VI-VI in FIG. 5.

As described above, advantages, which are similar to those of the second embodiment, can be achieved by providing the shield member 90 to the cap 100. Like in the second embodiment, the shield member 90 may be integrated with the cap 100 by insert molding or the like.

Fifth Embodiment

A fifth embodiment will be described. The present embodiment is a modification of the first embodiment in which the structure of the first and second magnetic flux guide members 71, 72 is changed. The rest of the present embodiment is the same as that of the first embodiment and will not be described here.

Figure 24:
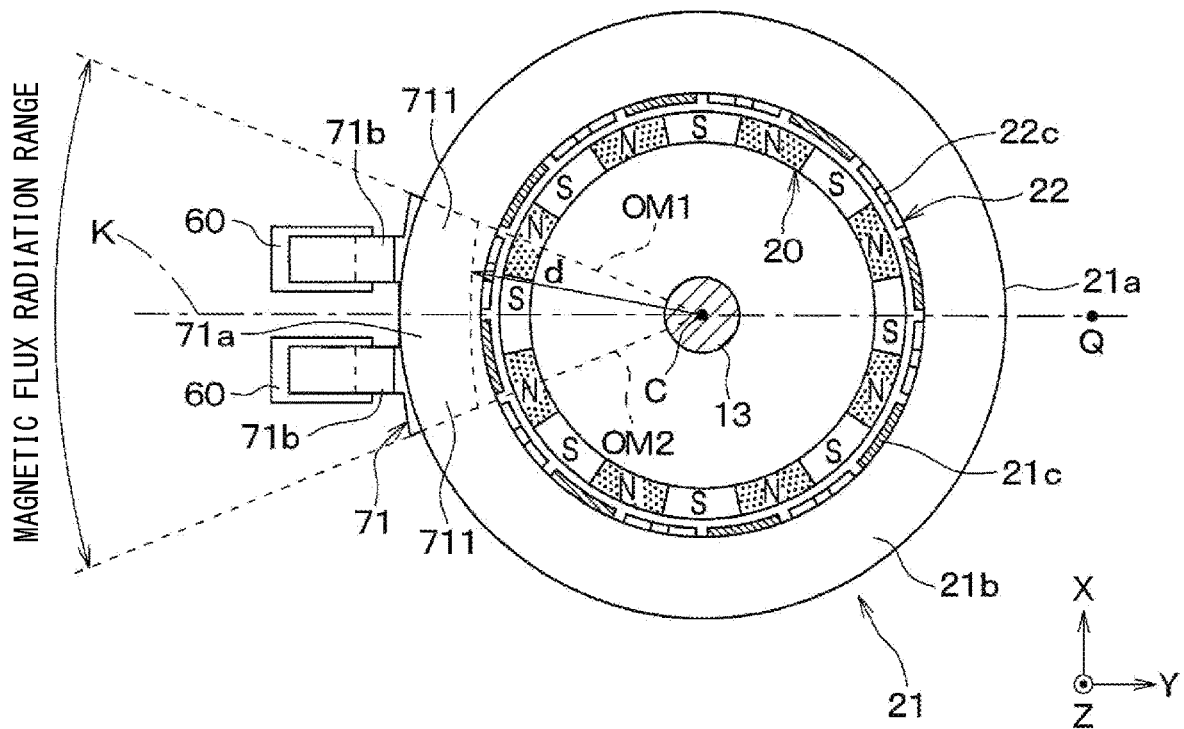
FIG. 24 is a diagram indicating a positional relationship between a first magnetic flux guide member and a first magnetic circuit portion according to a fifth embodiment.

In the present embodiment, as shown in FIG. 24, when the torque sensing device 10 is formed by using the magnetic sensor 30, the main body 71a of the first magnetic flux guide member 71 is shaped in an arcuate strip form that has two concentric arcuate edges which are radially opposed to each other and are arranged symmetrically with respect to the reference line K in the axial view. Specifically, the main body 71a is shaped in the arcuate strip form that has the two concentric arcuate edges that has a center of curvature at a point Q and has a curvature smaller than that of an arc centered on the rotational axis C while the point Q is located on an opposite side of the rotational axis C, which is opposite to the magnetic sensing devices 60, along the reference line K.

Although not depicted in a drawing, the second magnetic flux guide member 72 has a shape that is substantially the same as that of the first magnetic flux guide member 71.

As described above, even when the main bodies 71a, 72a are shaped in the arcuate strip form, advantages, which are similar to those of the first embodiment, can be achieved. The first embodiment, in which the radially inner edge of the main body 71a, 72a of each of the first and second magnetic flux guide members 71, 72 is a straight edge, can also be interpreted as a special form in which the point Q of the present embodiment exists at infinity and the curvature of the arc is infinitesimal.

Sixth Embodiment

A sixth embodiment will be described. The present embodiment is a modification of the first embodiment in which the structure of the first and second magnetic flux guide members 71, 72 is changed. The rest of the present embodiment is the same as that of the first embodiment and will not be described here.

Figure 25:
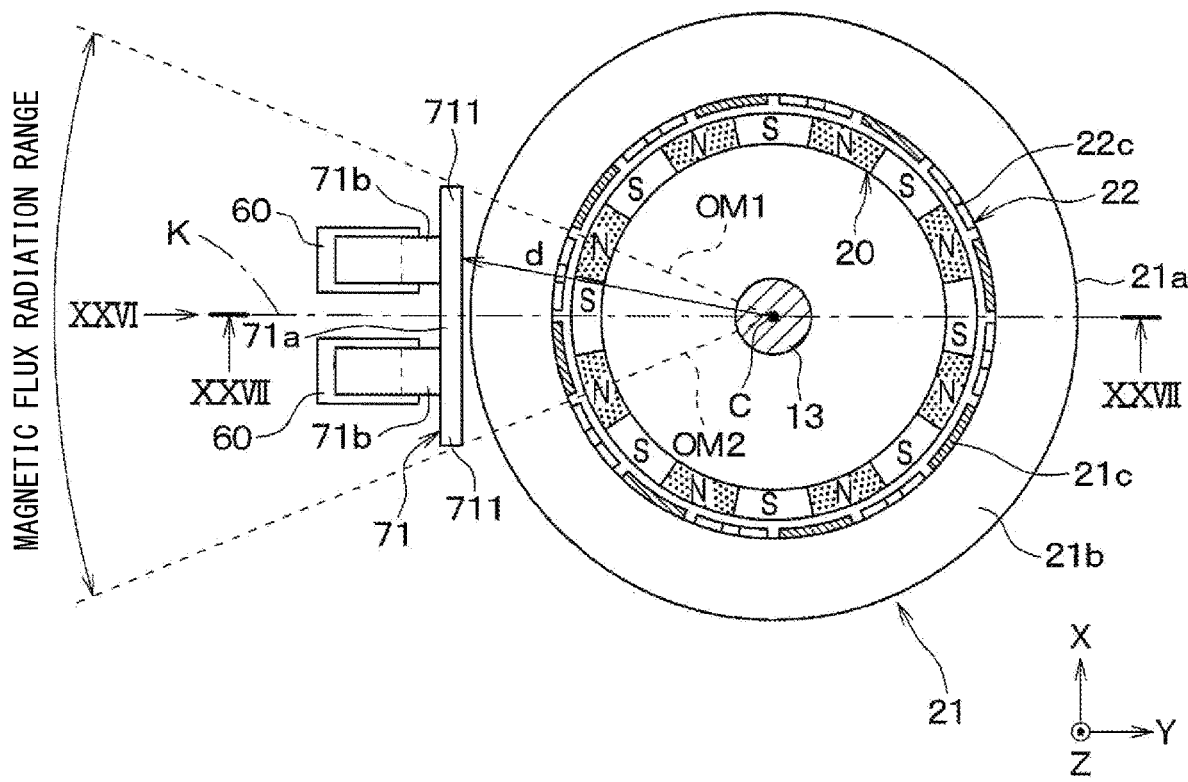
FIG. 25 is a diagram indicating a positional relationship between a first magnetic flux guide member and a first magnetic circuit portion according to a sixth embodiment.
Figure 26:
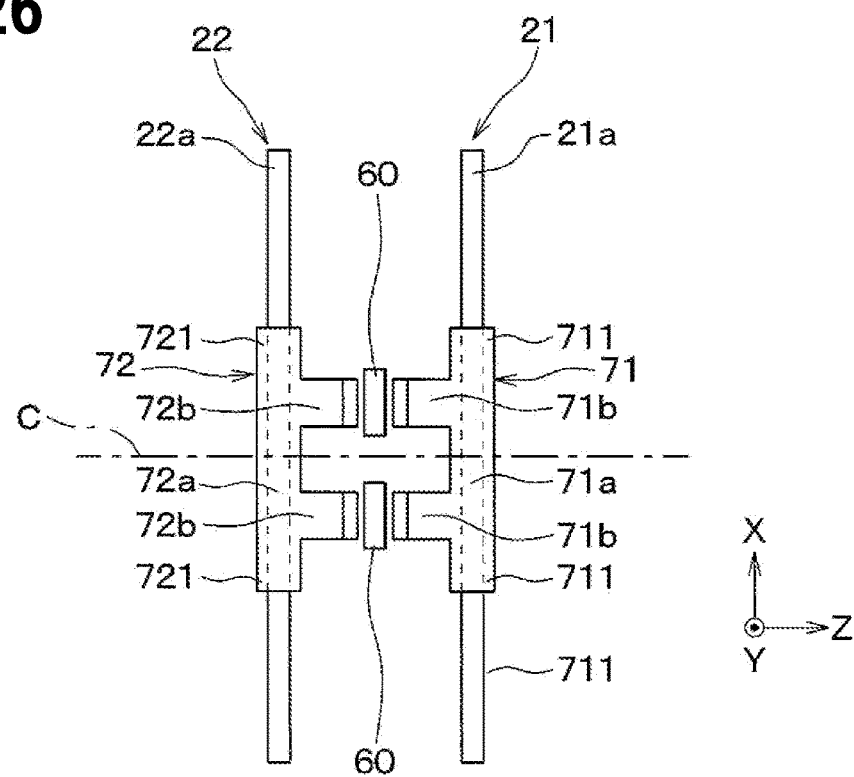
FIG. 26 is a plan view seen in a direction XXVI in FIG. 25.
Figure 27:
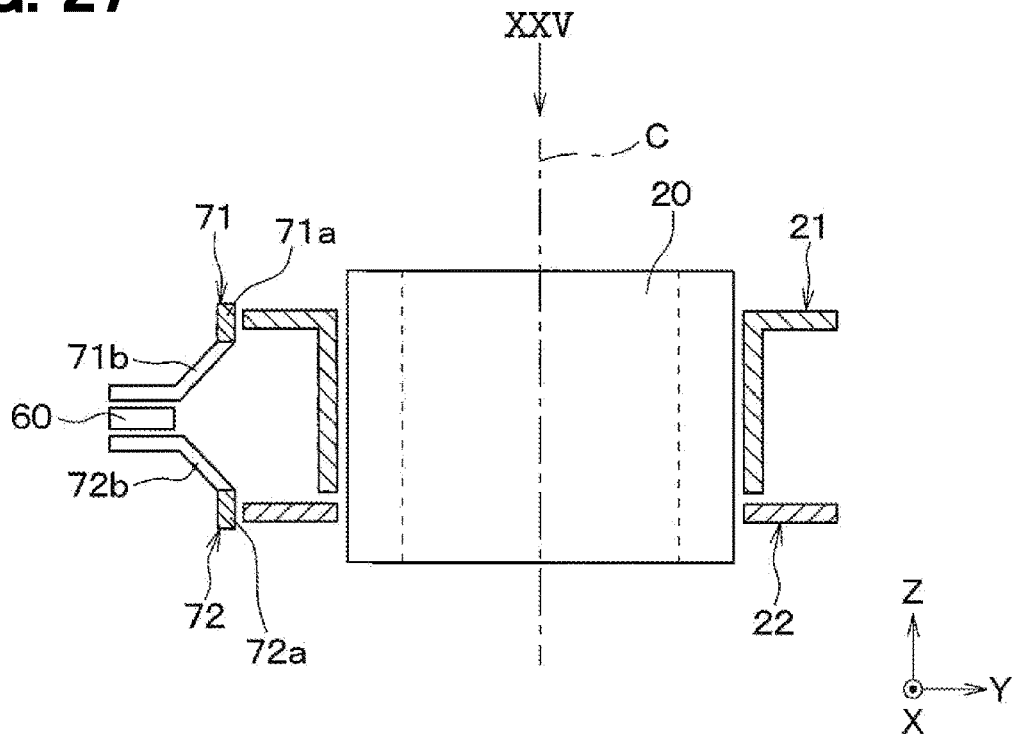
FIG. 27 is a cross-sectional view taken along line XXVII-XXVII in FIG. 25.

In the present embodiment, as shown in FIGS. 25 to 27, when the torque sensing device 10 is formed by using the magnetic sensor 30, the first and second magnetic flux guide members 71, 72 are arranged as follows. Specifically, each of the first and second magnetic flux guide members 71, 72 is arranged such that in the axial view, the main body 71*a*, 72*a* is located on the radially outer side of the outer peripheral edge of each of the first and second magnetic circuit portions 21, 22. More specifically, the first and second magnetic flux guide members 71, 72 are respectively opposed to the outer peripheral surfaces of the first and second ring plates 21*b*, 22*b* in the radial direction.

As described above, even when the first and second magnetic flux guide members 71, 72 are placed on the radially outer side of the first and second magnetic circuit portions 21, 22, advantages, which are similar to those of the first embodiment, can be achieved.

Seventh Embodiment

A seventh embodiment will be described. The present embodiment is a modification of the first embodiment in which the structure of the first and second magnetic flux guide members 71, 72 is changed. The rest of the present embodiment is the same as that of the first embodiment and will not be described here.

Figure 28:
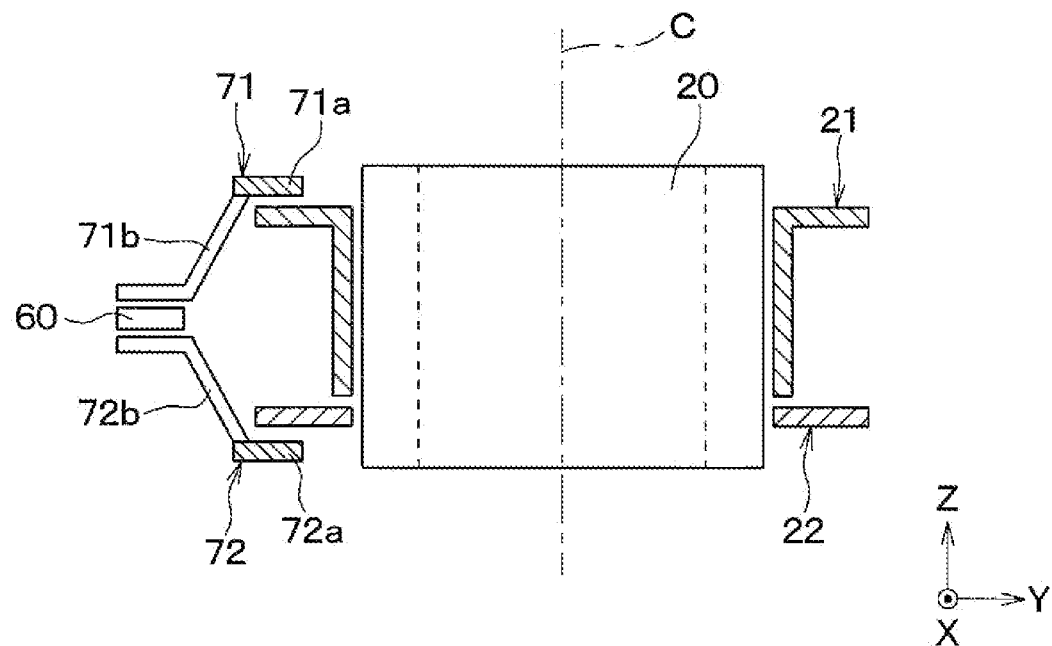
FIG. 28 is a diagram indicating a positional relationship between first and second magnetic flux guide members and first and second magnetic circuit portions according to a seventh embodiment.

In the present embodiment, as shown in FIG. 28, when the torque sensing device 10 is formed by using the magnetic sensor 30, the main bodies 71*a*, 72*a* of the first and second magnetic flux guide members 71, 72 are respectively placed on an outer side of the first and second magnetic circuit portions 21, 22 in the axial direction. Specifically, the main body 71*a*, 72*a* of each of the first and second magnetic flux guide members 71, 72 is opposed to an annular surface of the corresponding one of the first and second ring plates 21*b*, 22*b* of the first and second magnetic circuit portions 21, 22 on the outer side thereof in the axial direction. In other words, each of the first and second magnetic flux guide members 71, 72 is arranged such that the main body 71*a*, 72*a* is opposed to the corresponding one of the first and second magnetic circuit portions 21, 22 on the outer side thereof in the axial direction.

As described above, even when each of the first and second magnetic flux guide members 71, 72 is placed on the axially outer side of the corresponding one of the first and second magnetic circuit portions 21, 22, advantages, which are similar to those of the first embodiment, can be achieved. Each of the first and second magnetic flux guide members 71, 72 may be shaped in the arcuate strip form that has two concentric arcuate edges which are radially opposed to each other like in the fifth embodiment.

Modification of Seventh Embodiment

Figure 29:
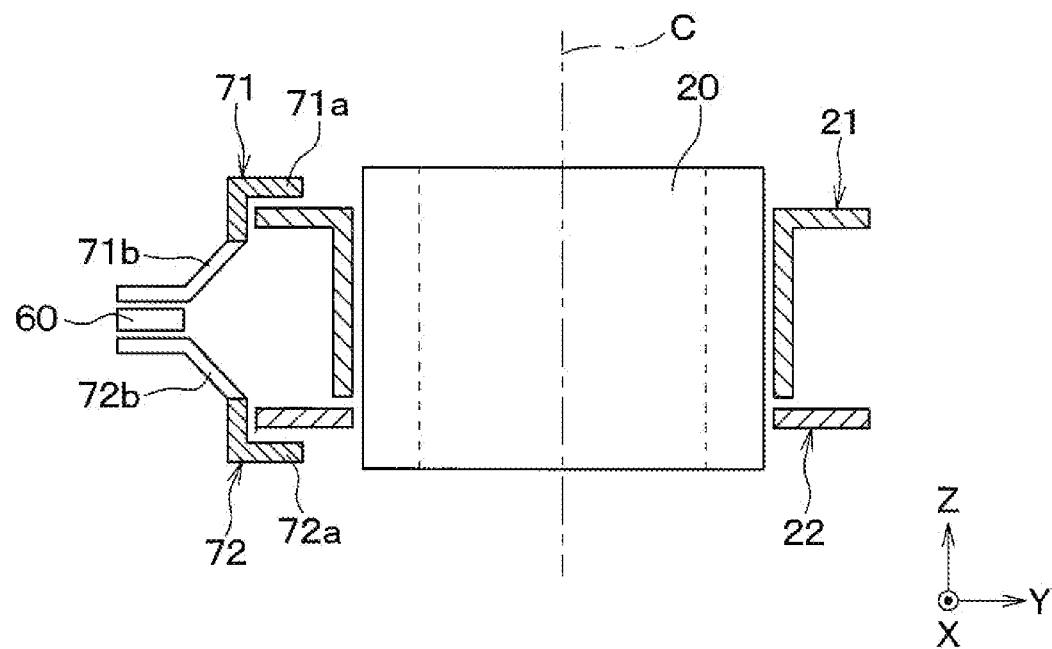
FIG. 29 is a diagram indicating a positional relationship between first and second magnetic flux guide members and first and second magnetic circuit portions in a modification of the seventh embodiment.

A Modification of the seventh embodiment will now be described. In the seventh embodiment, as shown in FIG. 29, each of the first and second magnetic flux guide members 71, 72 may be shaped to oppose the annular surface and the outer peripheral surface of the corresponding one of the first and second ring plates 21*b*, 22*b* of the first and second magnetic circuit portions 21, 22 on the axially outer side and the radially outer side of the corresponding one of the first and second ring plates 21*b*, 22*b*. In such a case, a cross-section of each of the main bodies 71*a*, 72*a* is shaped generally in an L-form to oppose the outer peripheral surface of the corresponding one of the first and second ring plates 21*b*, 22*b* besides the annular surface of the corresponding one of the first and second ring plates 21*b*, 22*b*.

Eighth Embodiment

An eighth embodiment will be described. The present embodiment is a modification of the first embodiment in which the structure of the first and second magnetic flux guide members 71, 72 is changed. The rest of the present embodiment is the same as that of the first embodiment and will not be described here.

Figure 30:
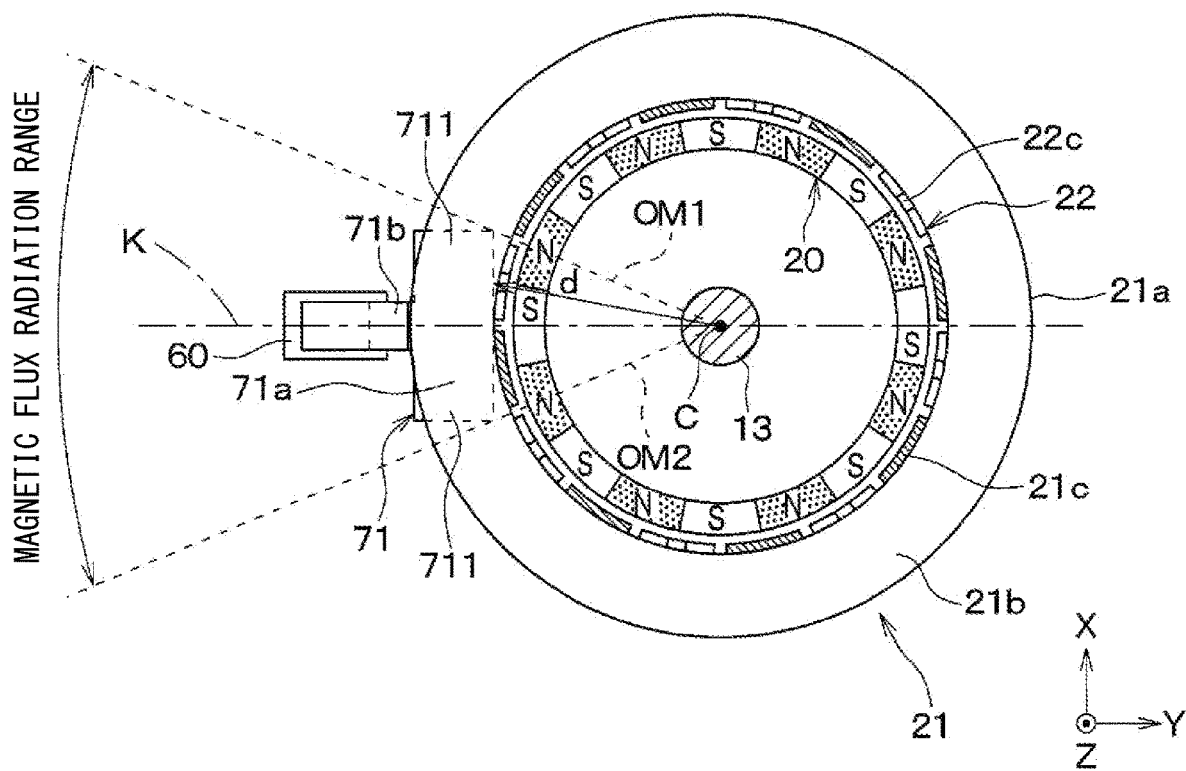
FIG. 30 is a diagram indicating a positional relationship between a first magnetic flux guide member and a first magnetic circuit portion according to an eighth embodiment.

First of all, in each of the above embodiments, the number of the magnetic sensing devices 60 is two. Alternatively, there may be provided only one magnetic sensing device 60. In such a case, as shown in FIG. 30, the first magnetic flux guide member 71 includes only one extension 71*b*. The second magnetic flux guide member 72 has a shape that is substantially the same as that of the first magnetic flux guide member 71. Furthermore, in this structure, the reference line K is an imaginary straight line that connects between the single magnetic sensing device 60 and the rotational axis C.

Advantages, which are similar to those of the first embodiment, can be achieved even with the above-described structure, in which the only one magnetic sensing device 60 is provided instead of the two magnetic sensing devices 60.

Ninth Embodiment

A ninth embodiment will be described. The present embodiment is a modification of the first embodiment in which the structure of the first and second magnetic flux guide members 71, 72 is changed. The rest of the present embodiment is the same as that of the first embodiment and will not be described here.

Figure 31:
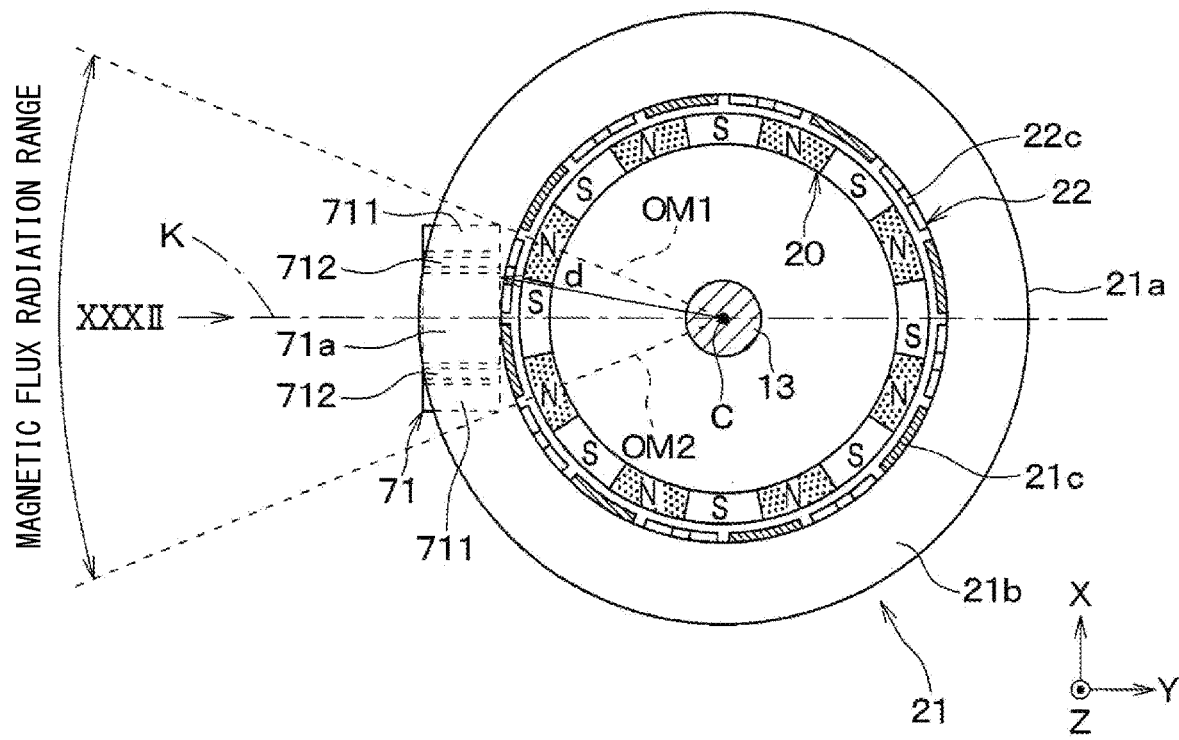
FIG. 31 is a diagram indicating a positional relationship between a first magnetic flux guide member and a first magnetic circuit portion according to a ninth embodiment.
Figure 32:
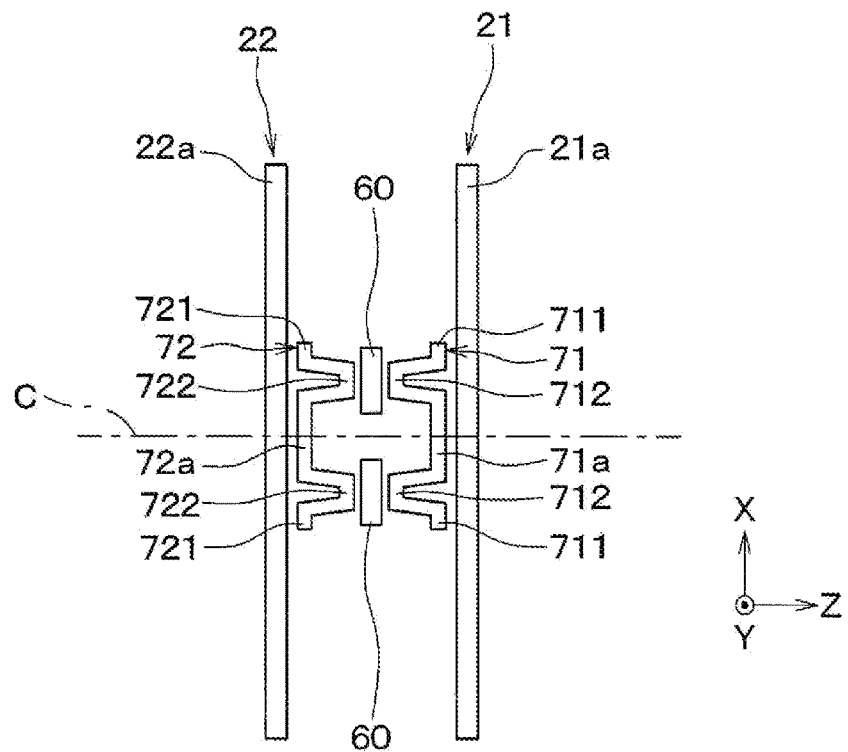
FIG. 32 is a plan view seen in a direction XXXII in FIG. 31.

In the present embodiment, as shown in FIGS. 31 and 32, each of the first and second magnetic flux guide members 71, 72 is formed only by the main body 71*a*, 72*a* shaped in the rectangular strip form and does not have the extensions 71*b*, 72*b*. Furthermore, each of the first and second magnetic flux guide members 71, 72 includes two bent portions 712, 722 that are formed by axially bending two portions of the main body 71*a*, 72*a* respectively opposed to the two magnetic sensing devices 60. Specifically, each of the first and second magnetic flux guide members 71, 72 includes the bent portions 712, 722 that are formed by axially bending the two portions of the main body 71*a*, 72*a* toward the main body 71*a*, 72*a* of the other one of the first and second magnetic flux guide members 71, 72.

In the present embodiment, the bent portions 722 of the second magnetic flux guide member 72 are placed in the opening 55.

Advantages, which are similar to those of the first embodiment, can be achieved even when the bent portions 712, 722 are formed at the main bodies 71*a*, 72*a* without forming the extensions 71*b*, 72*b*.

Other Embodiments

Although the present disclosure has been described with reference to the embodiments, the present disclosure should not be limited to those embodiments and the structure described in those embodiments. The present disclosure includes modifications and variations within an equivalent range. In addition, various combinations and forms, as well as other combinations and forms that include only one element, more, or less of the above-described embodiments and modifications, are also within the scope of the present disclosure.

For example, in each of the above embodiments, each direction is set for convenience of explanation of the embodiment. Thus, the axial direction of the rotational axis C is a direction that intersects the vehicle height direction in many cases.

Furthermore, in each of the above embodiments, the circuit board 50 may not be shaped in the convex form (stepped form). Specifically, the width of the first section 51 and the width of the second section 52 may be equal to each other. Even in this magnetic sensor 30, each of the magnetic sensing devices 60 is installed to the circuit board 50 such that the terminals 62, which project outward from the one of the pair of side walls 61a, are located on the one side of the opening 55, and the terminals 62, which project outward from the other one of the pair of side walls 61a, are located on the other side of the opening 55. Therefore, it is possible to limit an increase in the width of the circuit board 50. That is, it is possible to limit an increase in the width of the sensor housing 40.

Furthermore, in each of the above embodiments, the shape of the opening 55 may be appropriately changed as long as each of the magnetic sensing devices 60 is installed to the circuit board 50 such that the terminals 62, which project outward from the one of the pair of side walls 61a, are located on the one side of the opening 55, and the terminals 62, which project outward from the other one of the pair of side walls 61a, are located on the other side of the opening 55.

Figure 33A:
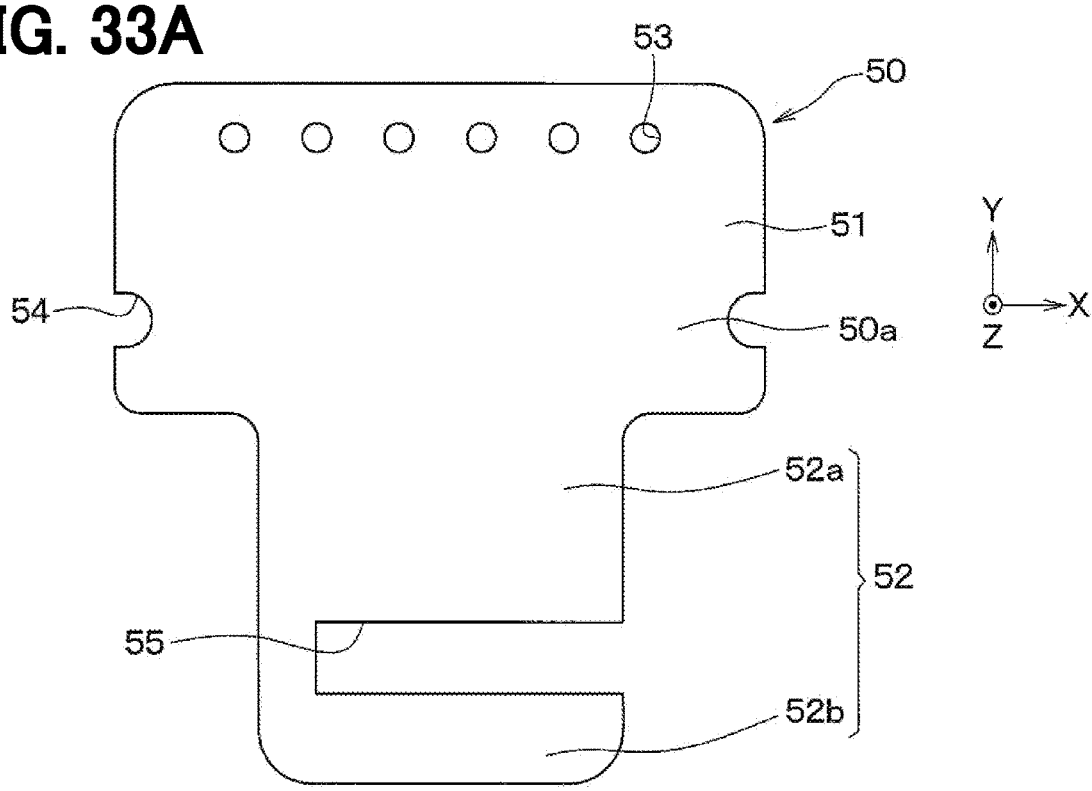
FIG. 33A is a plan view of a circuit board according to another embodiment.
Figure 33B:
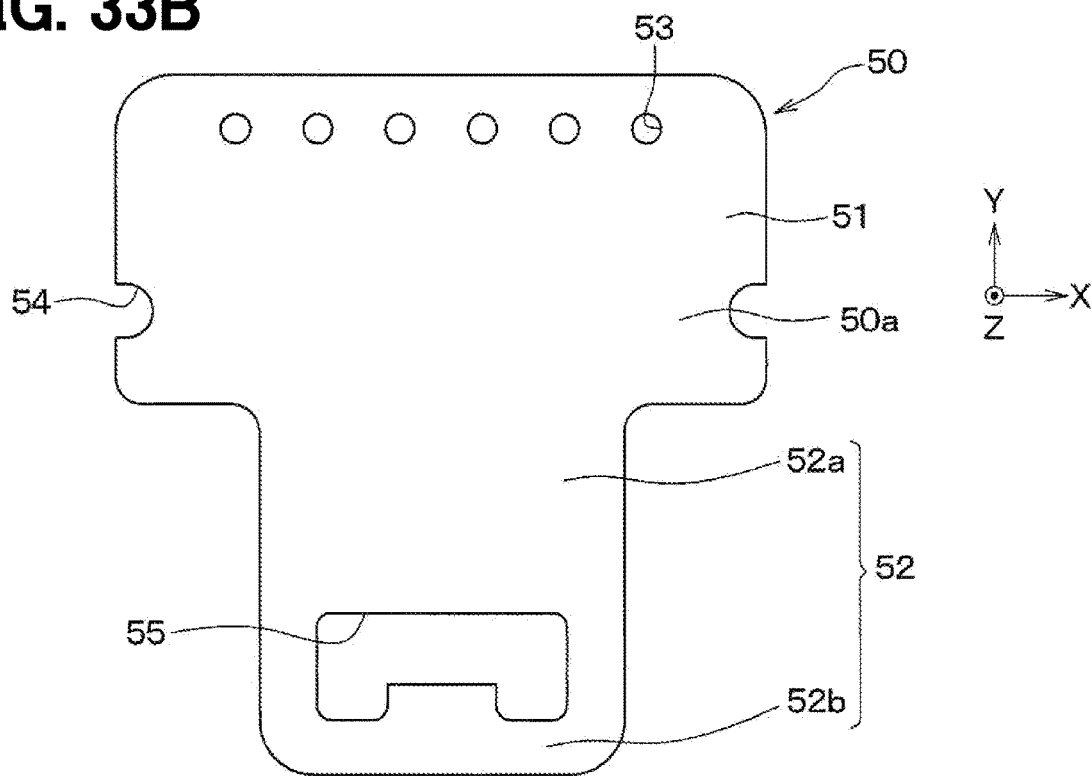
FIG. 33B is a plan view of a circuit board according to another embodiment.

For example, as indicated in FIG. 33A, the opening 55 may be formed such that the opening 55 opens to the outer edge of the circuit board 50 which extends in the direction of the Y-axis. Furthermore, as indicated in FIG. 33B, the opening 55 may be formed such that two opposite end portions of the opening 55, which are opposite to each other in the direction of the X-axis, are bent. Furthermore, although not depicted in a drawing, the opening 55 may be shaped in an elliptical form.

Furthermore, in each of the above embodiments, in which the main body 71a, 72a of each of the first and second magnetic flux guide members 71, 72 is shaped in the rectangular strip form, it is only required that the main body 71a, 72a is shaped generally in the rectangular strip form. Furthermore, in each of the above embodiments, in which the main body 71a, 72a of each of the first and second magnetic flux guide members 71, 72 is shaped in the arcuate strip form, it is only required that the main body 71a, 72a is shaped generally in the arcuate strip form.

Furthermore, in each of the above embodiments, the main body 71a, 72a of each of the first and second magnetic flux guide members 71, 72 may not be formed such that the number of magnetic poles in the radiation range is in the range of 1.2 to 2.8. Even with this configuration, the material, which forms the first and second magnetic flux guide members 71, 72, can be reduced in comparison to the case where the main body 71a, 72a of each of the first and second magnetic flux guide members 71, 72 is shaped in the annular form.

Furthermore, in each of the above embodiments, the circuit board 50 may be arranged such that the one surface 50a of the circuit board 50 is opposed to the bottom surface of the receiving recess 44. A portion of the first magnetic flux guide member 71 may be installed from the other surface 50b side into the opening 55 of the circuit board 50.

Furthermore, in each of the above embodiments, the receiving recess 44 may be formed such that the receiving recess 44 reaches the one end of the base body 41. Specifically, the receiving recess 44 may open to an end surface of the one end of the base body 41.

Furthermore, in each of the first to fourth embodiments, the shape of each of the first and second magnetic flux guide members 71, 72 may be appropriately changed as long as one of the first and second magnetic flux guide members 71, 72 is placed in the opening 55 of the circuit board 50. For example, each of the first and second magnetic flux guide members 71, 72 may have a portion, which is shaped in a ring form that surrounds the corresponding one of the first and second magnetic circuits 21, 22.

Furthermore, the torque sensing device 10 of each of the above embodiments may be applied not only to the electric power steering apparatus 1 but also to various devices for detecting a shaft torque.

Furthermore, the above embodiments may be combined in any appropriate manner. For example, the following combination may be implemented in the case where the torque sensing device 10 is constructed. Specifically, any one or more of the fifth to ninth embodiments may be combined with any one or more of the second to fourth embodiments such that the shapes of the first and second magnetic flux guide members 71, 72 and/or the positional relationship between the first and second magnetic flux guide members 71, 72 and the first and second magnetic circuits 21, 22 are changed. Furthermore, any one or more of the combinations of the above embodiments may be combined with another one or more of the combinations of the above embodiments.

What is claimed is:

1. A magnetic sensor configured to output an electrical signal corresponding to a magnetic flux generated between a first magnetic circuit portion and a second magnetic circuit portion which are opposed to each other, the magnetic sensor comprising:
    a sensor housing that has a receiving recess at one end portion of the sensor housing located at one end of the sensor housing, wherein the one end portion of the sensor housing is configured to face the first magnetic circuit portion and the second magnetic circuit portion;
    a circuit board that is received in the receiving recess;
    a magnetic sensing device that is installed to the circuit board and is configured to output the electrical signal which corresponds to the magnetic flux; and
    a pair of magnetic flux guide members that are respectively made of a soft magnetic material and are configured to guide the magnetic flux to the magnetic sensing device, wherein the pair of magnetic flux guide members are opposed to each other while the magnetic sensing device is interposed between the pair of magnetic flux guide members, wherein:
    the circuit board has:
        an opening;
        a front-side region which is located on a side of the opening where the one end of the sensor housing is placed; and
        a rear-side region which is located on an opposite side of the opening that is opposite to the front-side region;
    the magnetic sensing device has:

a main body which has a pair of side walls that are opposed to each other; and a plurality of terminals which project outward from the pair of side walls such that one or more of the plurality of terminals project outward from one of the pair of side walls, and another one or more of the plurality of terminals project outward from another one of the pair of side walls;

the magnetic sensing device is installed to the circuit board such that the main body overlaps the opening in a normal direction that is perpendicular to a plane of the circuit board, wherein the one or more of the plurality of terminals projecting outward from the one of the pair of side walls is located at the front-side region, and the another one or more of the plurality of terminals projecting outward from the another one of the pair of side walls is located at the rear-side region;

one of the pair of magnetic flux guide members is placed in the opening;

the circuit board has:
- a first section which is placed away from the one end of the sensor housing; and
- a second section, which is placed on a side of the first section where the one end of the sensor housing is placed;

the opening is formed in the second section to form the front-side region and the rear-side region in the second section; and a direction, in which the first section and the second section are aligned, is defined as an alignment direction, and a width of the second section, which is measured in a direction intersecting the alignment direction, is smaller than a width of the first section, which is measured in the direction perpendicular to the alignment direction.

2. The magnetic sensor according to claim 1, wherein a cap which is formed separately from the sensor housing, is installed to the one end portion of the sensor housing.

3. The magnetic sensor according to claim 2, wherein an O-ring, which is a sealing material, is installed in a groove that is formed at an outer wall surface of the cap.

4. The magnetic sensor according to claim 1, wherein a waterproof covering material, which integrally covers the pair of magnetic flux guide members, the circuit board and the magnetic sensing device, is arranged in the receiving recess of the sensor housing.

5. A torque sensing device configured to output an electrical signal that corresponds to a torsional torque generated at a torsion bar in response to relative rotation about a rotational axis between a first shaft and a second shaft which are coaxially coupled through the torsion bar along the rotational axis, the torque sensing device comprising:

the magnetic sensor of claim 1;

the first magnetic circuit portion that is placed at one side of a multipole magnet in an axial direction of the rotational axis, wherein the multipole magnet has a plurality of magnetic poles which are arranged in a circumferential direction about the rotational axis such that polarities of the plurality of magnetic poles are alternately changed in the circumferential direction, and the multipole magnet is placed coaxially with the torsion bar such that the multipole magnet is rotated about the rotational axis in response to the relative rotation; and the second magnetic circuit portion that is placed at another side of the multipole magnet in the axial direction, wherein:

the magnetic sensor is placed such that the pair of magnetic flux guide members are magnetically coupled to a magnetic circuit that is formed by the first magnetic circuit portion and the second magnetic circuit portion;

the pair of magnetic flux guide members include a first magnetic flux guide member, which has a main body opposed to the first magnetic circuit portion, and a second magnetic flux guide member, which has a main body opposed to the second magnetic circuit portion; and each of the main body of the first magnetic flux guide member and the main body of the second magnetic flux guide member is configured as follows:

the main body has a pair of outer end portions that are respectively placed on one circumferential side and another circumferential side of a reference line which is an imaginary line being perpendicular to the rotational axis and intersecting the main body;

a distance measured between the rotational axis and the main body is set such that the distance measured at each of the pair of outer end portions is longer than the distance measured at an intermediate portion of the main body circumferentially located between the pair of outer end portions; and one or more of the plurality of magnetic poles of the multipole magnet is placed in a magnetic flux radiation range of the first shaft that is a circumferential range defined between two imaginary lines while a number of the one or more of the plurality of magnetic poles of the multipole magnet is within a predetermined range, wherein one of the two imaginary lines radially connects a radially inner side part of one of the pair of outer end portions to the rotational axis, and another one of the two imaginary lines radially connects a radially inner side part of another one of the pair of outer end portions to the rotational axis.

6. The torque sensing device according to claim 5, wherein each of the main body of the first magnetic flux guide member and the main body of the second magnetic flux guide member is configured such that the number of the one or more of the plurality of multipole magnet included in the magnetic flux radiation range is in a range of 1.2 to 2.8.

* * * * *